(12) United States Patent
Ohtsu et al.

(10) Patent No.: US 7,756,366 B2
(45) Date of Patent: Jul. 13, 2010

(54) OPTICAL WAVEGUIDE FILM, METHOD OF PRODUCING THE SAME, AND OPTICAL TRANSMITTER AND RECEIVER MODULE

(75) Inventors: Shigemi Ohtsu, Kanagawa (JP); Akira Fujii, Kanagawa (JP); Kazutoshi Yatsuda, Kanagawa (JP); Masahiro Igusa, Kanagawa (JP); Toshihiko Suzuki, Kanagawa (JP); Keishi Shimizu, Kanagawa (JP)

(73) Assignee: Fuji Xerox Co., Ltd., Tokyo (JP)

( * ) Notice: Subject to any disclaimer, the term of this patent is extended or adjusted under 35 U.S.C. 154(b) by 0 days.

(21) Appl. No.: 12/405,818

(22) Filed: Mar. 17, 2009

(65) Prior Publication Data

US 2010/0021119 A1    Jan. 28, 2010

(30) Foreign Application Priority Data

Jul. 24, 2008  (JP) .............................. 2008-190981
Dec. 5, 2008   (JP) .............................. 2008-311163

(51) Int. Cl.
G02B 6/12  (2006.01)
G02B 6/10  (2006.01)

(52) U.S. Cl. ........................ 385/14; 385/129; 385/130
(58) Field of Classification Search ................. 385/14, 385/129–132

See application file for complete search history.

(56) References Cited

U.S. PATENT DOCUMENTS

| 5,076,663 | A | * | 12/1991 | Arendt et al. | ............... 359/884 |
| 7,582,919 | B2 | * | 9/2009 | Assal et al. | ................. 257/178 |
| 2004/0234224 | A1 | | 11/2004 | Ishizaki et al. | |
| 2005/0174924 | A1 | | 8/2005 | Martens et al. | |
| 2006/0177188 | A1 | | 8/2006 | Ishizaki et al. | |
| 2007/0031097 | A1 | * | 2/2007 | Heikenfeld et al. | ......... 385/129 |

FOREIGN PATENT DOCUMENTS

| JP | 6-222236 A | 8/1994 |
| JP | 6-281831 A | 10/1994 |
| JP | 2001-311846 A | 11/2001 |
| JP | 2002-333537 A | 11/2002 |
| JP | 2005-530286 A | 10/2005 |
| JP | 2007-148457 A | 6/2007 |
| JP | 2007-314841 A | 12/2007 |
| WO | 2004/027472 A1 | 4/2004 |

\* cited by examiner

*Primary Examiner*—Charlie Peng
(74) *Attorney, Agent, or Firm*—Sughrue Mion, PLLC

(57) ABSTRACT

An optical waveguide film includes: an optical waveguide film main body including an optical waveguide core through which light travels and a cladding portion that surrounds the optical waveguide core and has a lower refractive index than that of the optical waveguide core; an electric wiring portion including silver or a silver alloy and formed on at least a part of a principal surface of the optical waveguide film main body; and a protective layer including a titanium layer or a titanium alloy layer and disposed to cover the electric wiring portion.

10 Claims, 15 Drawing Sheets

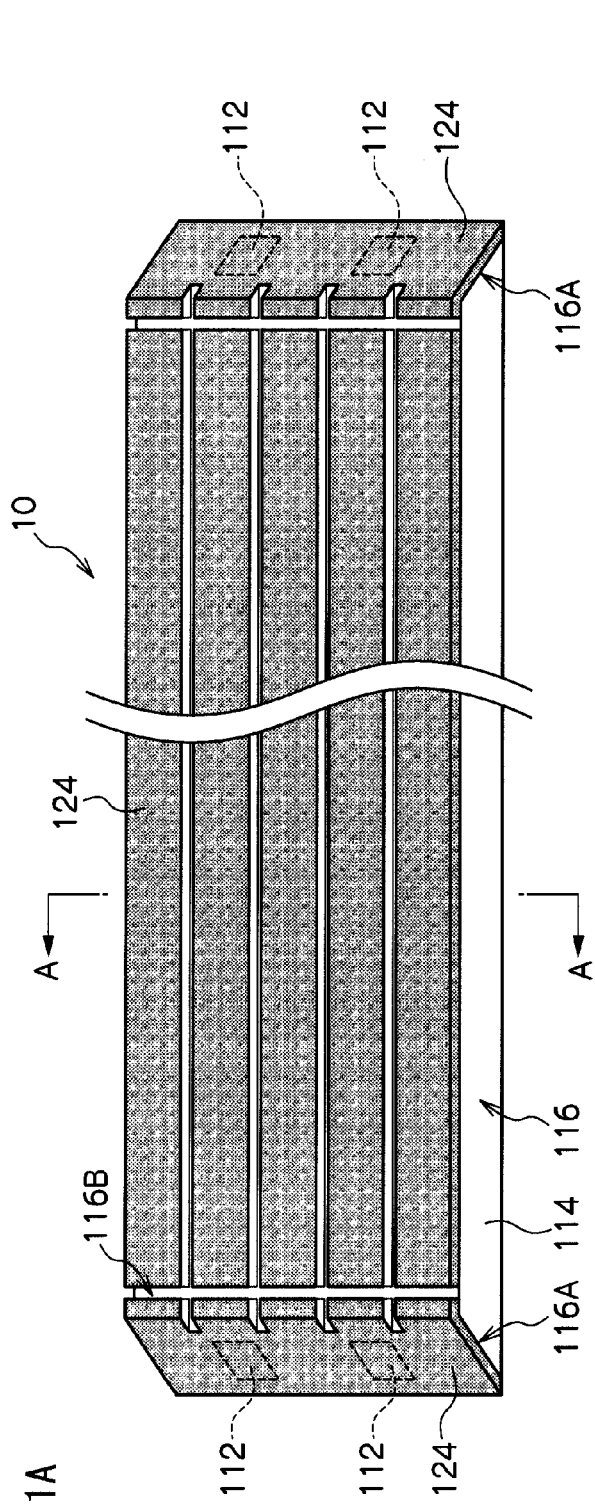
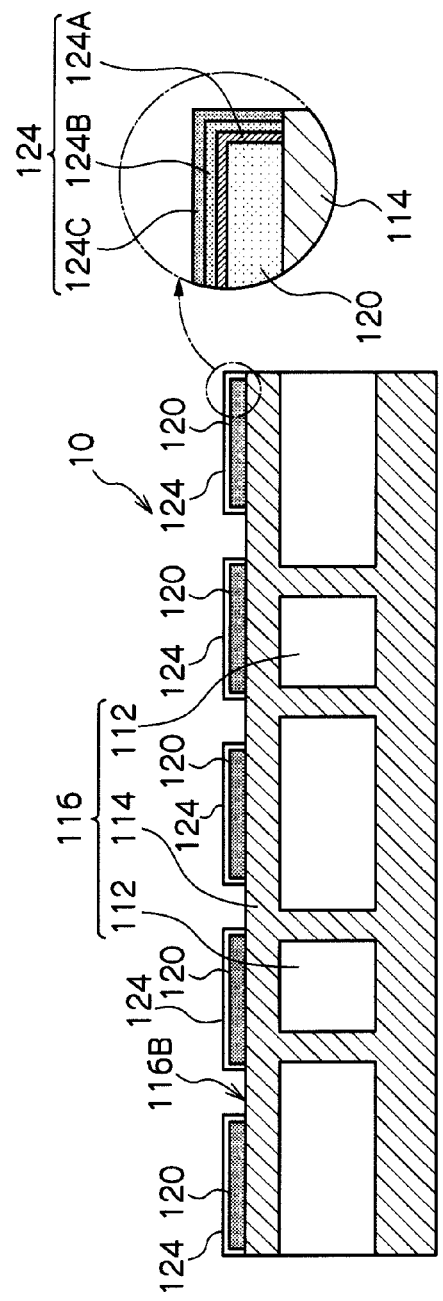
FIG. 1A
FIG. 1B

OPTICAL WAVEGUIDE FILM, METHOD OF PRODUCING THE SAME, AND OPTICAL TRANSMITTER AND RECEIVER MODULE

CROSS-REFERENCE TO RELATED APPLICATION

This application claims priority under 35 USC 119 from Japanese Patent Application Nos. 2008-190981 filed on Jul. 24, 2008 and 2008-311163 filed on Dec. 5, 2008.

BACKGROUND

1. Technical Field

The present invention relates to an optical waveguide film, a method of producing the same, and an optical transmitter and receiver module.

2. Related Art

Flexible electric wiring circuits have come to be widely used in general. With demands for higher speed signal processing techniques, transmission at a frequency of more than one giga Hz is sought. With respect to signal transmission at a frequency of more than one giga Hz, optoelectronic printed circuit boards have been studied in which optical signal transmission is conducted so as to reduce noise.

In mobile equipment, for example, not only high-speed signal processing but also reduction in power consumption are greatly desired. From the viewpoint of reducing power consumption, optical signal transmission is disadvantageous and it is practically difficult to completely eliminate electric signaling. Even when optical signal transmission is introduced, cables for electric wiring have always been necessary since power supply to a light-receiving/emitting device is always necessary. Therefore, the need for cables for electric wiring will disappear only after a flexible photoelectric-combined optical waveguide film is realized; further, a flexible photoelectric-combined optical waveguide film has flexibility as an optical waveguide film and thus has significant practical advantages.

Although electric wiring is preferably formed of silver or a silver alloy in consideration of cost, silver or silver alloy are vulnerable to oxidation, sulfuration, and chlorination, and are thus inferior in durability. Although silver alloys exist that are obtained by adding various metals to silver, even such alloys deteriorate over time and, therefore, it has been necessary to provide a thick resin protective layer. In consideration of demands for increased flexibility of an optical waveguide film, it is necessary to minimize the thickness of the protective layer for the electric wiring.

SUMMARY

According to an aspect of the invention, there is provided an optical waveguide film, including:

an optical waveguide film main body including an optical waveguide core through which light travels and a cladding portion that surrounds the optical waveguide core and has a lower refractive index than that of the optical waveguide core;

an electric wiring portion including silver or a silver alloy and formed on at least a part of a principal surface of the optical waveguide film main body; and a protective layer including a titanium layer or a titanium alloy layer and disposed to cover the electric wiring portion.

BRIEF DESCRIPTION OF THE DRAWINGS

Exemplary embodiments of the present invention will be described in detail based on the following figures, wherein:

FIG. 1A is a schematic perspective view illustrating an optical waveguide film according to an exemplary embodiment, and FIG. 1B is a cross-sectional view taken along line A-A shown in FIG. 1A;

DETAILED DESCRIPTION

Figure 2B:
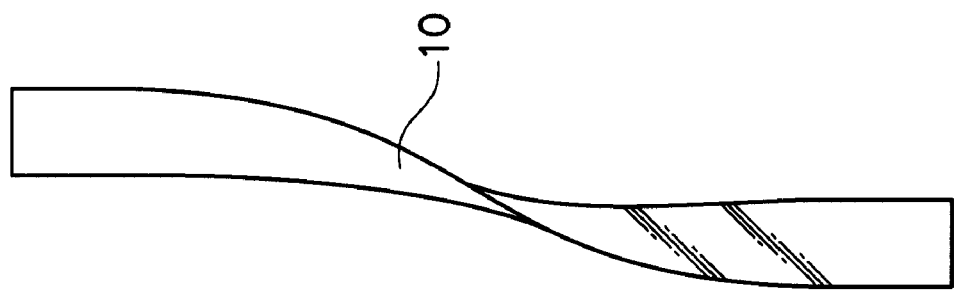
FIGS. 2A and 2B are perspective views showing that the optical waveguide film according to the exemplary embodiment has flexibility (bending property)

Exemplary embodiments of the present invention are described below with reference to the attached drawings. Elements having substantially the same function and action are designated by the same reference numeral throughout the drawings, and overlapping descriptions therefor are sometimes omitted.

Optical Waveguide Film

Figure 2A:
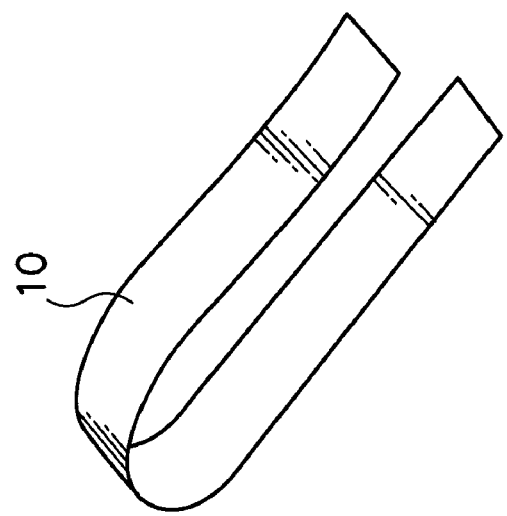

FIGS. 1A and 1B are schematic structural diagrams illustrating an optical waveguide film according to an exemplary embodiment of the invention. FIG. 1A is a perspective view, and FIG. 1B is a cross-sectional view taken along line A-A shown in FIG. 1A. FIGS. 2A and 2B are perspective views indicating that an optical waveguide film according to an exemplary embodiment has flexibility (bending property).

Optical waveguide film 10 according to the present exemplary embodiment is, for example, a belt-shaped optical waveguide, and has optical waveguide film main body 116 including cladding 114 and optical waveguide cores 112 embedded in cladding 114 as shown in FIGS. 1A and 1B. Optical waveguide film main body 116 has, at each end thereof in a longitudinal direction thereof, mirror surface 116A (inclined surface) serving as an optical-path deflecting portion for light traveling through optical waveguide 112. On mirror surface 116A, mirror layer 118 (not shown) is formed. Electric wiring portions 120 are formed at principal surface 116B, which is one of the two principal surfaces of optical waveguide film main body 116. Mirror layer 118 and electric wiring portions 120 are covered with protective layer 124. "Principal surface" as used herein refers to a surface that is perpendicular to the thickness direction of the film.

Specifically, in the case of an optical waveguide film produced in accordance with the method shown in FIGS. 3A to 3E, for example, the term, "principal surface" of optical waveguide film main body 116 (polymer film 10A), refers to a surface that is perpendicular to the direction of layering of cladding layer 114A, core layer 112A, and cladding layer 114B (i.e., perpendicular to the thickness direction of optical waveguide film main body 116). Meanwhile, in the case of an optical waveguide film produced in accordance with the method shown in FIGS. 4A to 4E, for example, the term, "principal surface" of optical waveguide film main body 116 (polymer film 10A), refers to a surface that is perpendicular to the direction of layering of cladding layer 114A, core layer 112A, and cladding layer 114B (i.e., perpendicular to the thickness direction of optical waveguide film main body 116). In other words, optical waveguide film main body 116 has substantially planar surfaces including an upper surface and a lower surface, and the upper and lower surfaces are each referred to as a "principal surface" of the optical waveguide.

Although not shown in the drawings, a part of an end portion at an end of each electric wiring portion 120 in the longitudinal direction thereof may be a protective-layer-free region at which protective layer 124 is not formed; the region may, for example, enable electric connection to the outside (for example, connection by wire to the below-mentioned optical transmitter and receiver module). The electric wiring portion 120 exposed at the protective-layer-free region may be protected by a bonding member such as wire bonding.

Optical waveguide cores 112 have a higher refractive index than that of cladding 114. When the difference in refractive index between optical waveguide cores 112 and cladding 114 (the difference between the refractive index of optical waveguide cores 112 and the refractive index of cladding 114) is, for example, 3%, an optical waveguide film is obtained which exhibits hardly any bend loss down to a curvature radius of 1.5 mm when bent. A larger difference in refractive index enables reduction of the curvature radius at which bend loss does not occur. However, in consideration of mechanical bending property of the optical waveguide film and loss caused at the connection to an optical transmitter and receiver element, the difference in refractive index may be from about 2% to about 5%. When the difference in refractive index is from 3% to 4%, optical loss observed when the optical waveguide is bent to a practical degree is very small (even at a curvature radius of 1 mm), and the connection to an optical transmitter and receiver element is easy; therefore, a difference in this range is practically favorable.

Plural optical waveguide cores 112 are arranged in the same plane in the direction of the width of optical waveguide film 10, and are arranged parallel to each other such that a beam of light propagates through each waveguide core 112 and the respective beams travel in parallel to each other. In the present exemplary embodiment, two optical waveguide cores 112 are disposed. At each end of each optical waveguide core 112 in the longitudinal direction thereof, mirror surface 116A is formed at an oblique angle with respect to the longitudinal direction. Mirror surface 116A is configured to form an angle of, for example, 45° with respect to the longitudinal direction of the optical waveguide core 112. When light propagating through the optical waveguide core 112 reaches the mirror surface 116A, the light is reflected by a layer adjacent to the mirror surface 116A (mirror layer 118 in this exemplary embodiment), so that the direction of the light propagation is changed. Although the angle of the mirror surface is described as 45° herein, sufficient optical-path deflecting function is achieved at any angle as long as the deviation from 45° is no more than the critical angle of the waveguide, because the optical-path deflection is performed by a metal reflective layer. For example, when the difference in refractive index between the core and cladding of the optical waveguide is 3%, the critical angle is 23.6°, and therefore a mirror surface having an angle within a range of from 21.4° to 68.6°, which is a range in which the difference from 45° is within the critical angle, can function as a reflective surface having a 90° optical-path deflecting function (a function of changing the direction of the optical path by 90°).

When optical waveguide film 10 is covered with a flame-retardant resin as described below, there is a possibility that the flame-retardant resin may get around to between a light-emitting/receiving device and the optical waveguide film through a capillary phenomenon, and may cause decrease in the amount of light due to absorption by the flame-retardant resin. However, when a light-emitting/receiving device is adhered to an optical waveguide film with a transparent material filling the space between the light-emitting/receiving device and the optical waveguide film, and mirror layer 118 (metal layer) is formed on mirror surface 116A, the entry of the flame-retardant resin can be prevented, and thus the decrease in the amount of light transmitted though the optical waveguide film is also prevented.

Cladding 114 is formed of a material having a lower refractive index than that of optical cores 112, and is disposed to enclose optical waveguide cores 112.

Each of the material for optical waveguide cores 112 and the material for cladding 114 is not particularly limited as long as the material is transparent at a wavelength used for optical waveguide film 10 and provides a desired difference in refraction index between optical waveguide core 112 and cladding 114. Examples thereof include an alicyclic olefin resin, an acrylic resin, an epoxy resin, and a polyimide resin.

When optical waveguide film 10 is covered with a flame-retardant resin as described below, it is preferable to use an acrylic resin or an epoxy resin as a material of cladding 114 at least at a region at which optical waveguide film 10 contacts the flame-retardant resin layer, from the viewpoint of obtaining excellent adhesiveness to the flame-retardant resin layer.

Electric wiring portions 120 are disposed to extend in the longitudinal direction of optical waveguide film main body 116 from one end of optical waveguide film main body 116 to the other end thereof. In the present exemplary embodiment, five electric wiring portions 120 are disposed in parallel and are arranged with a given interval therebetween in the width direction of optical waveguide film main body 116. The five electric wiring portions 120 may serve as one power wire, two signal wires, and two grounding wires.

Electric wiring portions 120 may be formed of a layer of the same metal as that of mirror layer 118. The metal layer includes silver or a silver alloy. Silver alloys have been developed that exhibit less change over time than the change that a usual silver exhibits over time, and the silver alloy for the metal layer may be selected from such silver alloys. Examples of such a silver alloy include silver alloys manufactured by Mitsubishi Materials Corporation, such as those sold under the tradenames of Alloy No. 37, Alloy No. 109, and Alloy No. 110.

The metal layer to be provided as electric wiring portions 120 and mirror layer 118 preferably has a thickness of from 500 nm to 5 μm or from about 500 nm to about 5 μm, and more preferably from 500 nm to 2 μm or from about 500 nm to about 2 μm. It is preferable that the metal layer forming electric wiring portions 120 has, for example, adequate electric conductivity and ability to provide tight adhesion between optical waveguide film main body 116 and the metal layer for electric wiring by wire bonding or the like. From the viewpoint of allowing wire bonding, the metal layer preferably has a thickness of 300 nm or more. From the viewpoint of providing conductivity suitable for electric wiring, the thickness of the metal layer is preferably 500 nm or more when the metal layer is formed of an Ag alloy, for example. Therefore, the thickness of the metal layer is preferably within the ranges. When the metal layer (electric wiring portions) has such a thickness, the same metal layer can be used for forming mirror layer 118, which is practically preferable and reduces cost.

Protective layer 124 includes titanium-silver alloy layer (Ti—Ag layer) 124A, titanium layer (Ti layer) 124B, and titanium nitride layer (TiN layer) 124C disposed in this order from the mirror layer 118 and electric wiring portion 120 side. In the description of the present exemplary embodiment, protective layer 124 is described as having a three-layer structure. However, the structure of protective layer 124 is not limited thereto, and protective layer 124 may be constituted, for example, by titanium layer 124B and titanium nitride layer 124C or by titanium-silver alloy layer 124A and titanium layer 124B. When a thin titanium film is formed on a silver or silver alloy film by a sputtering method, titanium tends to diffuse into the silver or silver alloy to form a titanium-silver alloy. Therefore, there may be no independent "pure titanium layer"; in this case, the presence of an alloy of silver and titanium on the silver surface can be confirmed. In other words, the protective layer may have only titanium-silver alloy layer instead of including a discreet titanium layer. Specifically, for example, the protective layer may be integrated with the reflective layer. Such an integrated structure may be a single film of a complex alloy in which a titanium-silver alloy layer is integrally formed on a silver or silver alloy film. In this structure, the reflective layer and the protective layer are integrated, and the integrated layer is formed by a complex alloy in which a surface of the metal layer (the integrated layer) containing the silver or silver alloy is formed by a titanium-silver alloy.

Protective layer 124 preferably has a total thickness of from 10 nm to 500 nm, more preferably from 10 nm to 200 nm, and still more preferably from 10 nm to 50 nm. Each of the layers constituting protective layer 124 (each of titanium-silver alloy layer 124A, titanium layer 124B, and titanium nitride layer 124C) preferably has a thickness of from 5 nm to 50 nm, and more preferably from 5 nm to 25 nm. By adjusting the thickness to fall within the above range, the deterioration of electric wiring portions 120 and mirror layer 118 (reflective layer) is prevented while the protective layer is prevented from being excessively thick.

When titanium layer 124B is formed by a sputtering method as described below, the thickness of titanium layer 124B in protective layer 124 refers to the thickness of the layer further including titanium-silver alloy layer 124A since titanium-silver alloy layer 124A is formed at the interface with a lower layer (electric wiring layer 120 or mirror layer 118 formed of silver or a silver alloy) simultaneously with the formation of the titanium layer.

Optical waveguide film 10 may be formed by a flexible transparent resin film. As shown in FIGS. 2A and 2B, optical waveguide film 10 has flexibility (high bending property) when deformed (for example, bent or twisted) even when optical waveguide film 10 has electric wiring portions 120 (when optical waveguide film 10 is covered with a flame-retardant resin as described below). Therefore, optical signals transmitted from an optical transmitter and receiver section propagate through an optical waveguide formed in optical waveguide film 10 and are received by another optical transmitter and receiver section even when optical waveguide film 10 is deformed. Optical waveguide film 10 may have such flexibility as to give a minimum bending radius of 3 mm or less. Assuming that a minute portion of a curve formed at the inner side of bent optical waveguide film 10 is approximated to an arc of a circle, the minimum bending radius is a value indicating the minimum radius of the circle. The permissible range thereof is measured by bending test (ASTM D-2176).

Optical waveguide film 10 preferably has a thickness of from 50 μm to 500 μm, and more preferably from 50 μm to 200 μm. The width of optical waveguide film 10 is preferably from 0.2 mm to 10 mm, and more preferably from 0.25 mm to 5 mm.

A method of producing optical waveguide film 10 according to the present exemplary embodiment is described below. FIGS. 3A to 3E are process charts showing a method according to an exemplary embodiment for producing an optical waveguide film. FIGS. 4A to 4E are process charts showing a method according to another exemplary embodiment for producing an optical waveguide film. FIGS. 3A to 3E and FIGS. 4A to 4E are process charts at a cross-section taken along line A-A shown in FIG. 1A.

Figure 3A:
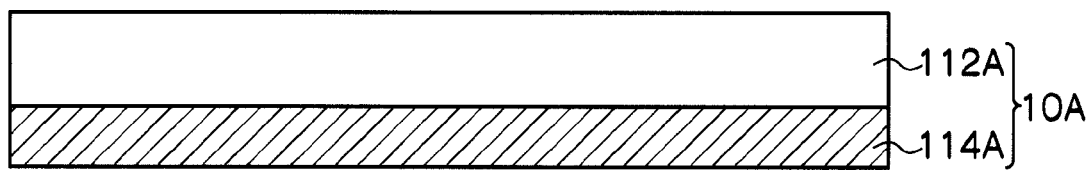
FIGS. 3A to 3E are process charts showing a method of producing an optical waveguide film according to the exemplary embodiment.

In the method of producing optical waveguide film 10 according to the exemplary embodiment, polymer film 10A (laminated material) in which core layer 112A is disposed on cladding layer 114A is prepared as shown in FIG. 3A. The method of providing the respective layers of polymer film 10A is not particularly limited as long as the disposed layers are tightly adhered such that separation between the layers does not occur. A known method may be used, such as a laminating method or a spin coating method.

The material for forming cladding layer 114A is not particularly limited as long as there will be a certain difference in refractive index between the obtained cladding layer 114A and core layer 112A (optical waveguide core 112). The material for forming cladding layer 114A may be selected according to the application, in consideration of, for example, the refractive index, optical characteristics such as optical transmittance, mechanical strength, heat resistance, and flexibility of the material. Examples of the material include radiation-curable resins, electron-beam-curable resins, and thermosetting resins. The material is preferably a UV-curable resin or a thermosetting resin, more preferably a UV-curable or thermosetting monomer, a UV-curable or thermosetting oligomer, or a mixture of the monomer and the oligomer, and still more preferably a UV-curable resin.

Examples of the material for forming cladding layer 114A include epoxy resins, acrylic resins (such as polymethyl methacrylate), alicyclic acrylic resins, styrene resins (such as polystyrene or an acrylonitrile-styrene copolymer), olefin resins (such as polyethylene, polypropylene, or an ethylene-propylene copolymer), alicyclic olefin resins, vinyl chloride resins, vinylidene chloride resins, vinyl alcohol resins, vinyl butyral resins, arylate resins, fluorine-containing resins, polyester resins (such as polyethylene terephthalate or polyethylene naphthalate), polycarbonate resins, cellulose diacetate, cellulose triacetate, amide resins (such as an aliphatic or aromatic polyamide), imide resins, sulfone resins, polyethersulfone resins, polyetheretherketone resins, polyphenylene sulfide resins, polyoxymethylene resins, and blends thereof.

Cladding layer 114A may be provided, for example, (a) by applying dropwise a liquid resin selected from the above materials onto a substrate such as a glass substrate, making the thickness of the liquid resin uniform by spin coating, and curing the resin, or (b) by using an already-formed resin film.

The thickness of cladding layer 114A is not particularly limited, and is preferably from 10 μm to 100 μm, more preferably from 20 μm to 50 μm, in consideration of factors such as optical properties, flexibility, after-mentioned cutting processability, and strength.

The material for forming core layer 112A may be, for example, a UV-curable resin, such as a UV-curable monomer, a UV-curable oligomer, or a mixture of the monomer and the oligomer. Examples of the material for forming a core include epoxy UV-curable resins and acrylic UV-curable resins.

For example, a curable resin for a core (a UV-curable resin) in a liquid state may be applied, in a uniform thickness, to cladding layer 114A, and the resin is cured by irradiation with UV rays using, for example, a UV lamp, a UV-LED, or a UV irradiation apparatus, whereby core layer 112A is formed.

The thickness of core layer 112A is not particularly limited, and may be set appropriately in accordance with the use. The thickness of core layer 112A is preferably from 20 μm to 120 μm, and more preferably from 30 μm to 90 μm, in consideration of factors such as optical properties, flexibility, after-mentioned cutting processability, and strength.

The size and total thickness of polymer film 10A are not particularly limited, and may be appropriately set in accordance with the material, use, and the like. For example, in order for optical waveguide film 10 to have flexibility, the thickness of polymer film 10A is preferably from 50 μm to 500 μm, and more preferably from 50 μm to 200 μm. The width of polymer film 10A is preferably from 0.2 mm to 10 mm, and more preferably from 0.25 mm to 5 mm. When the thickness and width of optical waveguide film 10 are set within the above range, flexibility and strength suitable for an optical waveguide can be easily secured.

Figure 3B:
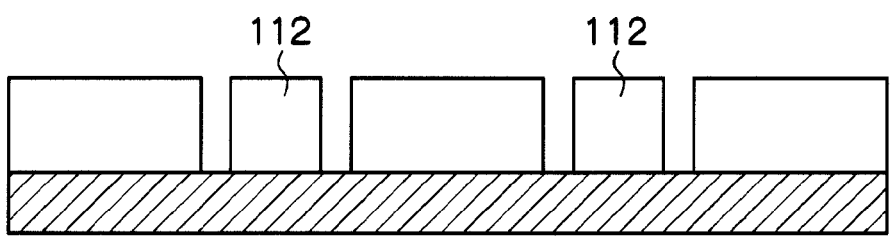

Thereafter, as shown in FIG. 3B, polymer film 10A is cut from the core layer 112A side (i.e., core layer 112A is cut) to form optical waveguide cores 112. The formation of optical waveguide cores 112 can be performed by, for example, cutting polymer film 10A along the longitudinal direction of polymer film 10A with a dicing saw and repeating the cutting with a predetermined spacing in the width direction of polymer film 10A (the spacing will be the width of each optical waveguide core 112). By the cutting, plural optical waveguide cores 112 are formed that are disposed in the same plane on cladding layer 114A and that are parallel to each other, such that a beam of light travels through each core and the respective beams are parallel to each other and separated in the direction of the width of polymer film 10A. In the exemplary embodiment, two optical waveguide cores 112 are formed. In order to perform the cutting with a dicing saw, dicing tape 130 is adhered to polymer film 10A prior to the cutting.

Figure 3C:
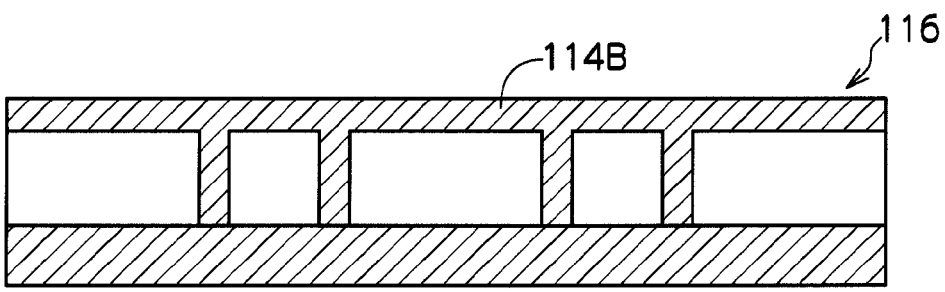

Then, as shown in FIG. 3C, optical waveguide cores 112 are covered with a curable resin for forming cladding. In other words, the curable resin for forming cladding is applied to fill the grooves that have been formed by the cutting, and the resin is cured to form cladding layer 114B. Specifically, for example, a curable resin for cladding is applied dropwise to a surface of polymer film 10A that has been cut, and is spread by a centrifugal force according to a spin coating method, so that the curable resin for cladding is applied on optical waveguide cores 112 and the respective grooves formed by the cutting are filled with the curable resin for cladding; then the resin is cured. The method for applying the curable resin for cladding is not limited to the spin coating method, and may be a method including spreading the curable resin for cladding by pressing a glass substrate against the resin with the thickness of the curable resin controlled by a spacer and exposing the resin to light so as to cure the resin. As a result, cladding 114 (cladding layers 114A and 114B) is formed to enclose optical waveguide cores 112.

The curable resin for forming cladding that is used for forming cladding layer 114B may be a material in a liquid state, and may be, for example, a radiation-curable resin, an electron-beam-curable resin, or a thermosetting resin. Among them, the curable resin is preferably a UV-curable resin or a thermosetting resin, and is more preferably a UV-curable resin. Examples of the UV-curable or thermosetting resin include a UV-curable or thermo setting monomer, a UV-curable or thermo setting oligomer, and a mixture of the monomer and the oligomer. Examples of the UV-curable resin include an epoxy UV-curable resin and an acrylic UV-curable resin. Examples of the thermosetting resin include a polyimide resin and a silicone resin.

Then, although not shown in the drawings, both ends of polymer film 10A, in which optical waveguide cores 112 are formed, in the longitudinal direction are cut to form mirror surface (inclined structure) having an angle of, for example, 45° with respect to the longitudinal direction of polymer film 10A at each of the both end surfaces of cladding 114 and each of the both end surfaces of each optical waveguide core 112. The cutting for making the end surface of cladding 114 and the end surface of each optical waveguide core 112 a mirror surface may be, for example, performed by cutting polymer film 10A with a dicing saw having a blade with a 45°-inclined structure at a blade edge.

Optical waveguide film main body 116 may be prepared as described above.

Figure 3D:
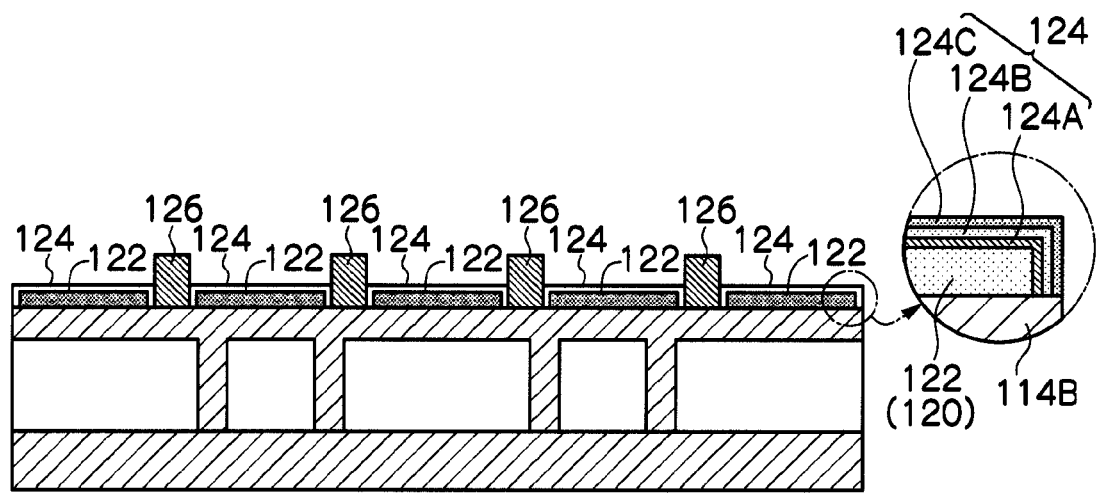

Thereafter, as shown in FIG. 3D, mask 126 having an aperture (an aperture pattern) is disposed at principal surface 116B of the obtained optical waveguide film main body 116. Mask 126 may be, for example, a metal mask (specifically, for example, a metal mask formed by electroformed nickel). In the present exemplary embodiment, as an example, description is given on mask 126 having a grid-shaped frame (the regions surrounded by the frame correspond to apertures). The grid-shaped frame is configured by frame bars (two in number) each of which serves to separate a portion of metal layer 122 formed on mirror surface 116A and another portion of metal layer 122 formed on principal surface 116B and other frame bars (four in number) that serve to separate, in the width direction of optical waveguide film main body 116, respective portions of metal layer 122 formed on principal surface 116B.

Figure 5:
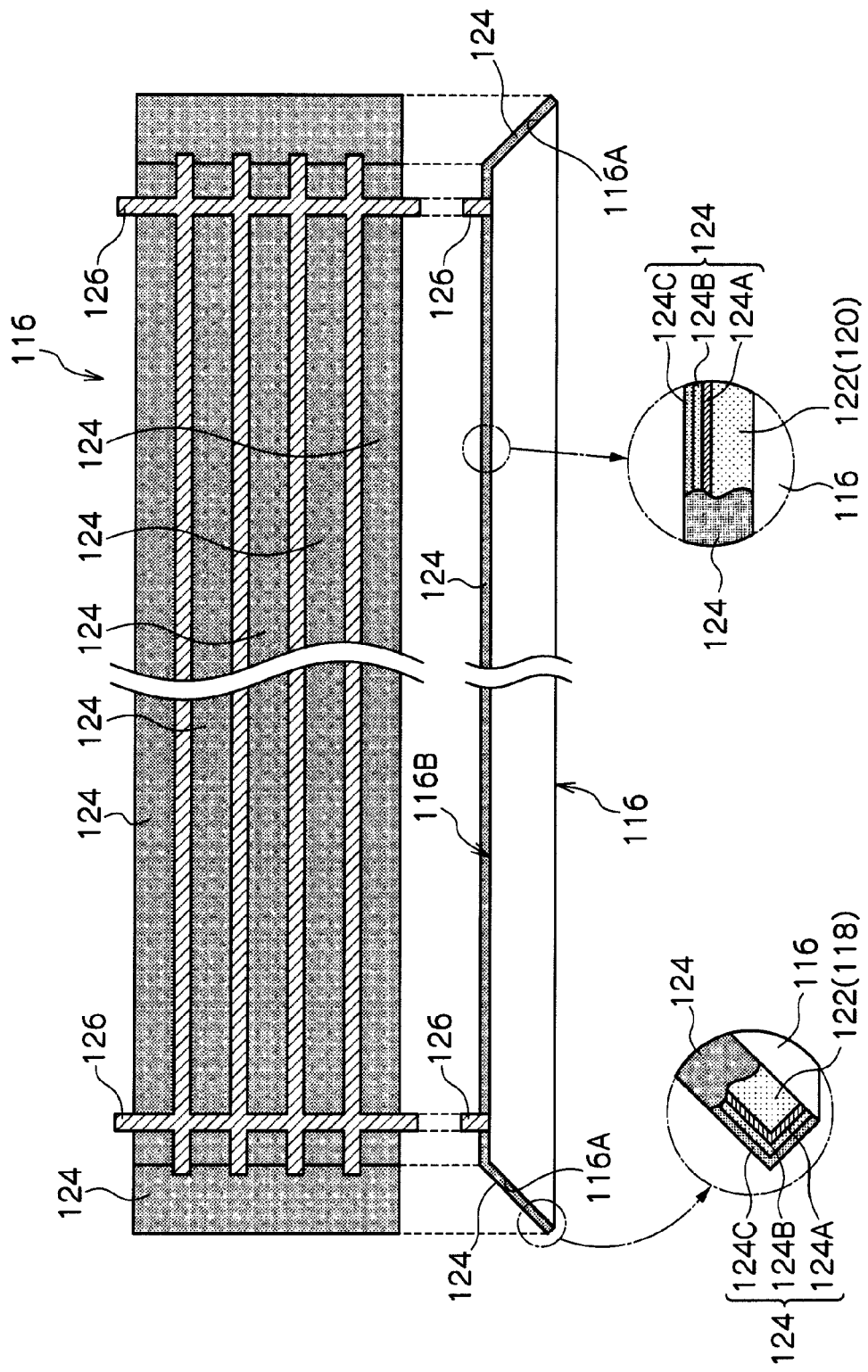
FIG. 5 is a two-view diagram (plan view being a diagram viewed from the thickness direction of the film, side view being a diagram viewed from the width direction of the film) showing a state in which metal layer 122 and a protective layer have been sequentially formed after mask 126 is disposed on optical waveguide film main body 116.

Metal layer 122 is formed at an entire principal surface 116B of optical waveguide film main body 116 on which mask 126 has been disposed as well as at an entire surface of each mirror surface 116A (see FIG. 5). Metal layer 122 may be, for example, formed by a sputtering method. FIG. 5 is a two-view diagram (plan view being a diagram viewed from the thickness direction of the film, side view being a diagram viewed from the width direction of the film) showing a state in which metal layer 122 and a protective layer have been sequentially formed after mask 126 was disposed on optical waveguide film main body 116.

Then, protective layer 124 is formed at (i) an entire principal surface 116B of optical waveguide film main body 116 on which metal layer 122 is formed at the apertures of mask 126, as well as (ii) an entire surface of each mirror surface 116A. In other words, protective layer 124 is formed to cover a portion of metal layer 122 formed at principal surface 116B of optical waveguide film main body 116 and another portion of metal layer 122 (mirror layer 118) formed at each mirror surface 116A. As protective layer 124, for example, titanium-silver alloy layer 124A (TiAg alloy layer), titanium layer 124B (Ti layer) and titanium nitride layer 124C (TiN layer) may be sequentially formed in this order from the side of metal layer 122 (the side of electric wiring portions 120 and mirror layer 118). These layers may be formed, for example, by a sputtering method.

Specifically, for example according to a sputtering method using titanium as a target, an argon gas is introduced into the apparatus, and discharge within the argon gas is performed to form a titanium layer 124B. When titanium is deposited on metal layer 122 (electric wiring portions 120 and mirror layer 118) containing silver or a silver alloy by a sputtering method, an alloy of titanium and silver is formed first. Therefore, titanium layer 124B is formed such that titanium-silver alloy layer 124A is provided between titanium layer 124B and metal layer 112 (electric wiring portions 120 and mirror layer 118).

Then, according to a sputtering method using titanium as a target, a nitrogen gas is mixed into an argon gas, and the mixed gas is introduced into the apparatus. Discharge within the mixed gas is performed to form titanium nitride layer 124C. When titanium nitride layer 124C is formed by a sputtering method, the characteristics of titanium nitride layer 124C and the constitutional ratio of titanium to nitrogen can be controlled by adjusting the pressure at the time of deposition and by changing the ratio of the flow rate of the argon gas to the flow rate of the nitrogen gas introduced into the apparatus. In particular, the film-forming conditions are preferably such conditions as to provide a titanium nitride layer in gold color, which is the natural color of titanium nitride. However, a titanium nitride layer can function as a protective layer even when it is colored in brown due to a heightened constitutional ratio of nitrogen. Regarding the film-forming conditions to be adopted, for example, the volume ratio (mixing ratio) of nitrogen to argon may be from 5% to 20%. The mixing ratio at which gold color is achieved changes depending on the pressure at deposition. For example, in a typical case, a gold-colored titanium nitride layer is formed at a mixing ratio of 10% at a deposition pressure of 0.3 Pa. Therefore, the control range for the formation of a titanium nitride layer by a sputtering method is broad, so that a desired titanium nitride layer can be obtained easily.

During sequential deposition of metal layer 122 (electric wiring portions 120 and mirror layer 118) and protective layer 124 (titanium-silver alloy layer 124A (Ti—Ag layer), titanium layer 124B (Ti layer), and titanium nitride layer 124C (Ti—N layer)) by a sputtering method, an upper layer is deposited to cover the principal surface of the layer just beneath as well as the side surfaces of the layer just beneath.

The formation of metal layer 122 (electric wiring portions 120 and mirror layer 118) and protective layer 124 (titanium layer 124B (including titanium-silver alloy layer 124A) and titanium nitride layer 124C) by the sputtering method may be conducted using either one or both of the following methods:

(1) a method of performing sputtering without heating polymer film 10A (optical waveguide film main body 116); for example, a heat source (heater) is not provided to a holding member that holds polymer film 10A (workpiece);

(2) a method including sputtering intermittently while changing the sputtering region (the region on which the sputtered substance is to be deposited);—for example, sputtering is conducted while moving the "target" and "polymer film 10A (optical waveguide film main body 116)" relative to each other (for example by rotation).

By using the methods described above, deterioration of (damage to) polymer film 10A (optical waveguide film main body 116) by heating of polymer film 10A (optical waveguide film main body 116) or by radiation heat are suppressed in the sputtering method, and deterioration of the performance of the obtained optical waveguide film 10A is suppressed. The methods are effective in the formation of protective layer 124 (titanium layer 124B (including titanium-silver alloy layer 124A) and titanium nitride layer 124C) since the formation of protective layer 124 is often conducted at a high sputtering temperature.

When the above methods are used, polymer film 10A (optical waveguide film main body 116) is not heated and stress due to radiation heat can be minimized in a sputtering method, so that sputtering can be conducted with a dicing tape still adhered to polymer film 10A (optical waveguide film main body 116). Since the dicing tape usually has low heat resistance, ingredients of the adhesive are released to the vacuum in a normal sputtering method of heating the material on which a layer is to be formed, so that, for example, the degree of vacuum is lowered. However, when the above-described methods are used, such phenomenon is suppressed. Therefore, in the present exemplary embodiment, sputtering can be conducted while a dicing tape adheres to polymer film 10A (optical waveguide film main body 116).

Figure 3E:
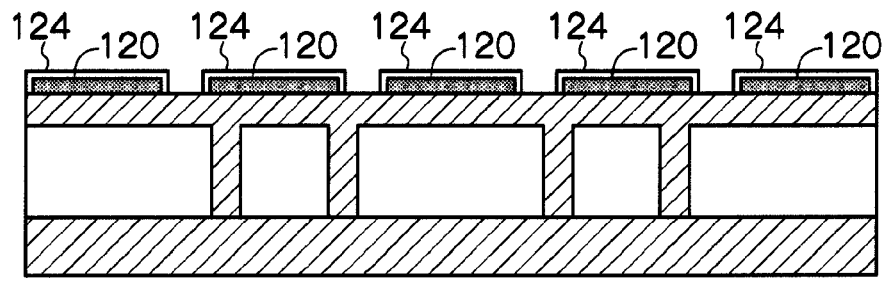
Figure 6:
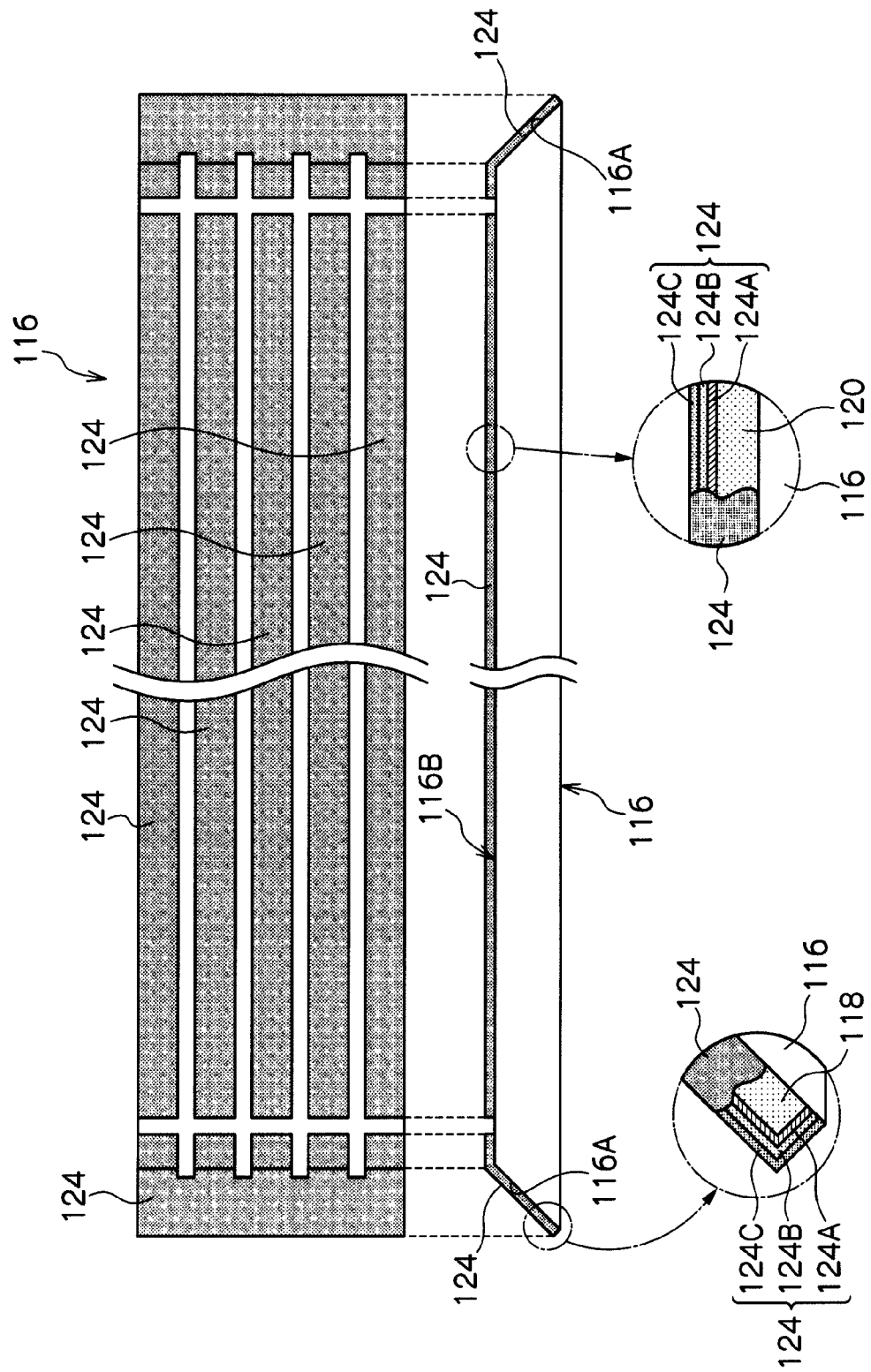
FIG. 6 is a two-view diagram (plan view being a diagram viewed from the thickness direction of the film, side view being a diagram viewed from the width direction of the film) showing a state when mask 126 is removed after metal layer 122 is formed on optical waveguide film main body 116.

Thereafter, as shown in FIG. 3E, mask 126 disposed on principal surface 116B of optical waveguide film main body 116 is removed (see FIG. 6). As a result, separately from a portion of metal layer 122 that is formed at each mirror surface 116A (mirror layer 118), electric wiring portions 120 are formed on principal surface 116B of optical waveguide film main body 116; electric wiring portions 120 are parallel to each other with a given interval therebetween in the width direction of optical waveguide film main body 116, and extend in the longitudinal direction of optical waveguide film main body 116 from one end thereof to the other end thereof. FIG. 6 is a two-view diagram (plan view being a diagram viewed from the thickness direction of the film, side view being a diagram viewed from the width direction of the film) showing a state in which mask 126 has been removed after metal layer 122 was formed on optical waveguide film main body 116.

In this way, optical waveguide film 10 having electric wiring portions 120 covered with protective layer 124 is formed.

Figure 4A:
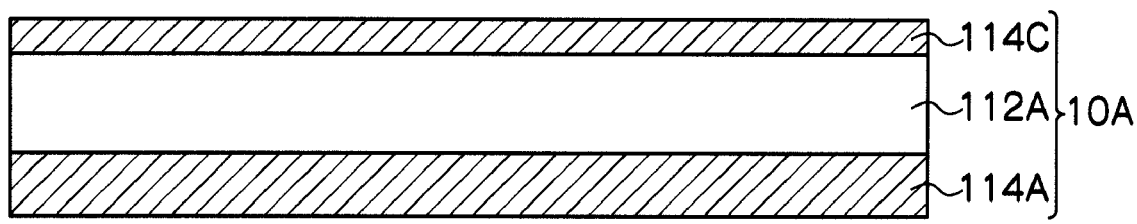
FIGS. 4A to 4E are process charts showing a method of producing an optical waveguide film according to another exemplary embodiment.

In a method according to another exemplary embodiment for producing optical waveguide film 10, polymer film 10A (laminated material) in which cladding layer 114A, core layer 112A, and cladding layer 114C are disposed in this order is prepared as shown in FIG. 4A. In other words, polymer film 10A is prepared in which core layer 112A is sandwiched between two cladding layers (cladding layer 114A and cladding layer 114C).

The material for forming cladding layer 114C is not particularly limited as long as a desired difference in refractive index between cladding layer 114C and core layer 112A will be obtained. The material for forming cladding layer 114C is preferably the same material as the material for forming cladding layer 114A. For example, cladding layer 114C may be formed by applying a liquid resin (the same liquid resin as that used for forming cladding layer 114A) to core layer 112A to form a coating with a uniform thickness, and curing the resin.

The thickness of cladding layer 114C is preferably from 5 μm to 100 μm, more preferably from 10 μm to 50 μm, in consideration of the optical characteristics, flexibility, after-mentioned cutting processability, and strength.

The thickness of cladding layer 114A and the thickness of cladding layer 114C are not necessarily the same. For example, the total thickness of polymer film 10A may be made small by setting the thickness of cladding layer 114C to a thickness that is smaller than the thickness of cladding layer 114A.

Figure 4B:
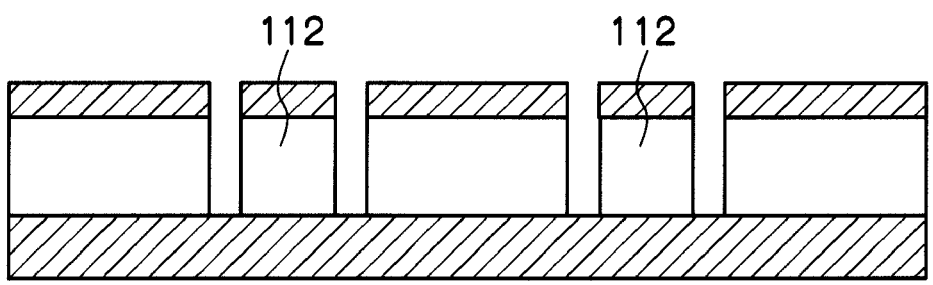

Then, as shown in FIG. 4B, polymer film 10A is cut from the cladding layer 114C side so as to cut through cladding layer 114C and core layer 112A, whereby optical waveguide cores 112 are formed.

Figure 4C:
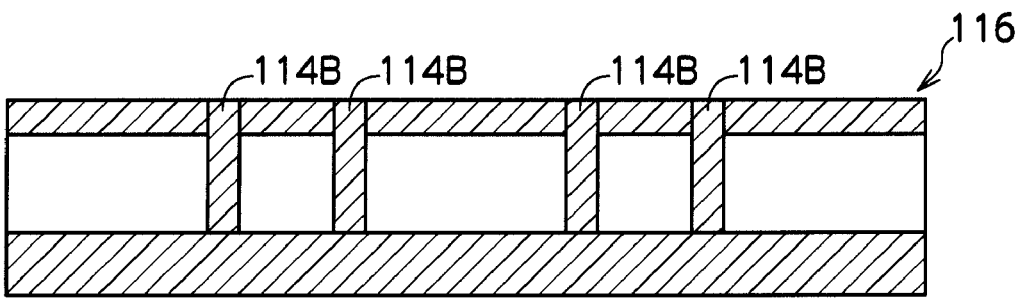

Then, as shown in FIG. 4C, optical waveguide cores 112 are embedded; i.e., a curable resin is applied so as to fill the spaces (grooves formed by the cutting) between plural optical waveguide cores 112 and the resin is cured to form cladding layer 114B. As a result, cladding 114 (cladding layers 114A, 114B, and 114C) is formed to surround optical waveguide cores 112.

Although not shown in the drawings, both ends of polymer film 10A (in which optical waveguide cores 112 are formed) in the longitudinal direction are cut so as to form mirror surface 116A (inclined surface) forming an angle of, for example, 45° with respect to the longitudinal direction of polymer film 10A on each of the both end surfaces of cladding 114 and each of the both end surfaces of each optical waveguide core 112.

In this way, optical waveguide film main body 116 is prepared.

Figure 4D:
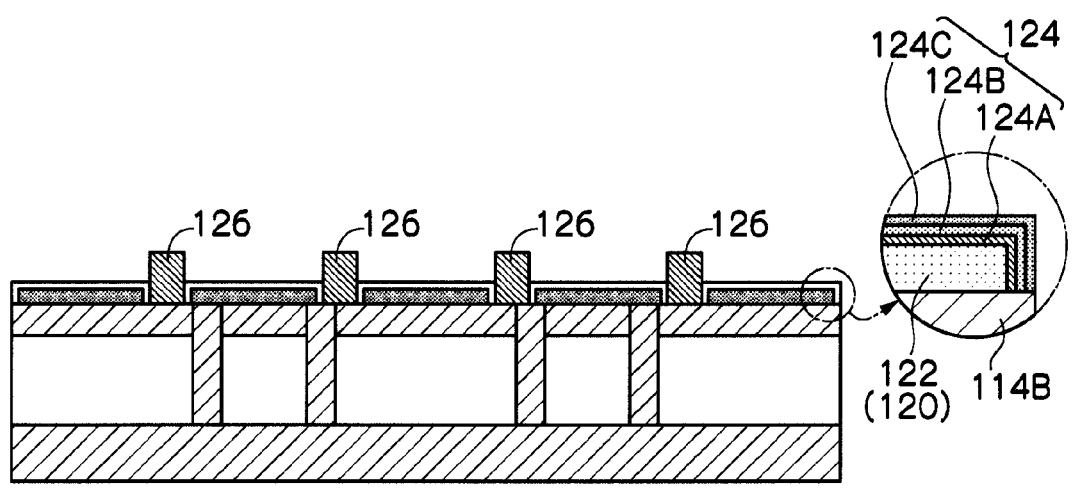

Then, as shown in FIG. 4D, mask 126 having an aperture is disposed at principal surface 116B of the obtained optical waveguide film main body 116. Metal layer 122 (electric wiring portions 120 and mirror layer 118) is formed at an entire principal surface 116B of optical waveguide film main body 116 on which mask 126 has been disposed as well as at an entire surface of each mirror surface 116A (see FIG. 5).

Figure 4E:
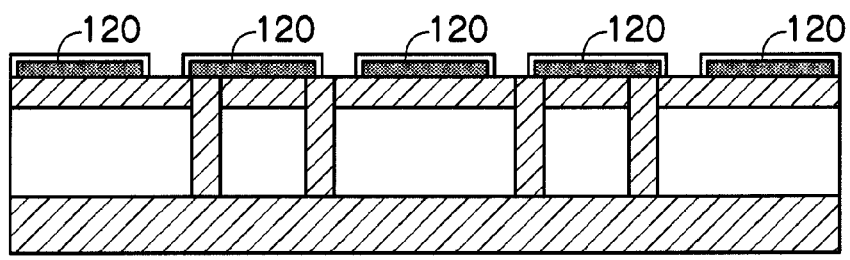

Then, as shown in FIG. 4E, mask 126 disposed at principal surface 116B of optical waveguide film main body 116 is removed (see FIG. 6). As a result, electric wiring portions 120 are formed; electric wiring portions 120 are parallel to each other with a given interval therebetween in the width direction of optical waveguide film main body 116, and extend in the longitudinal direction of optical waveguide film main body 116 from one end thereof to the other end thereof.

In this way, optical waveguide film 10 on which electric wiring portions 120 are formed is prepared. The method according to the present exemplary embodiment is the same as the method of producing optical waveguide film 10 illustrated in FIGS. 3A to 3E in respects other than those described above, and overlapping descriptions therefor are omitted.

Since optical waveguide film 10 according to the present exemplary embodiment described above has a structure in which electric wiring portions 120 are disposed at a principal surface of optical waveguide film main body 116, optical waveguide film 10 has high flexibility and is a photoelectric-combined optical waveguide film that performs electric conduction as well as light transmission.

In optical waveguide film 10 according to the present exemplary embodiment, metal layer 122 containing silver or a silver alloy is provided as electric wiring portions 120 (and mirror layer 118). Further, protective layer 124 including titanium layer 124B is disposed to cover electric wiring portions 120 (and mirror layer 118) so as to protect electric wiring portions 120 (and mirror layer 118).

As described above, in the present exemplary embodiment, metal layer 122 containing silver or a silver alloy, which is advantageous in terms of cost but easily deteriorated, is provided as electric wiring portions 120, and a layer including titanium layer 124B, which has high durability, is provided as protective layer 124 protecting electric wiring portions 120. Therefore, in the exemplary embodiment, low cost is realized and deterioration of the electric wiring layer is suppressed, compared with a case in which another kind of electric wiring layer and/or another kind of protective layer therefor are used. The material of mirror layer 118 (meta layer 122) disposed at a mirror surface (inclined surface) for deflecting an optical path is most preferably silver or a silver alloy from the viewpoints of reflection property in a near-infrared region and cost. Therefore, the obtained mirror layer 118 (reflection layer) has high reflectance in the near-infrared region and is less vulnerable to deterioration, compared with a case in which another kind of electric wiring layer and/or another kind of protective layer therefor are used.

In the exemplary embodiment, since titanium nitride layer 124C, having lower substance permeability (such as permeability to oxygen, sulfur, or chlorine) than that of titanium layer 124B, is further provided in protective layer 124, deterioration of electric wiring portions 120 (and mirror layer 118) may be further suppressed, compared to a case in which only titanium layer 124B is provided as protective layer 124. Moreover, since titanium nitride layer 124C covers electric wiring portions 120 (and mirror layer 118) formed of a metal layer containing silver or a silver alloy with titanium layer 124B therebetween, the adhesion between titanium nitride layer 124C to electric wiring portions 120 (and mirror layer 118) may be improved.

Further, in the exemplary embodiment, since titanium-silver alloy layer 124A as a sublayer of protective layer 124, containing components of both of titanium layer 124B and electric wiring portions 120 (and mirror layer 118), is disposed between titanium layer 124B and electric wiring portions 120 (and mirror layer 118), adhesion between titanium layer 124B and electric wiring portions 120 (and mirror layer 118) may be improved. In other words, the adhesion between protective layer 124 and electric wiring portions 120 (and mirror layer 118) may be improved.

The material for forming protective layer 124 may be an anti-corrosion metal (such as titanium), an anti-corrosion nitride (such as SiN or TiN), or an anti-corrosion oxide (such as $SiO_2$). In particular, a layer formed of the anti-corrosion metal or the anti-corrosion metal nitride has more uniform properties than those of a layer formed of the metal oxide, thereby having excellent characteristics suitable for various sealing films. However, the anti-corrosion metal or the anti-corrosion metal nitride is formed into a layer generally by CVD (Chemical Vapor Deposition) or PVD (Physical Vapor Deposition) under heating to a temperature within a range of from 500° C. to 600° C. Even when a sputtering method, by which film formation can be performed at lower temperatures, is used, heating to about 200° C. is still necessary at the time of film formation. Therefore, it is difficult to form a layer of the anti-corrosion metal or metal nitride on a polymer film (an optical waveguide film main body) formed of a resin having poor heat resistance.

Specifically, when a sputtering method is used to form titanium layer 124B and titanium nitride layer 124C, the substrate (the material on which a layer is to be formed) is usually heated to a temperature within a range of from 200° C. to 300° C., so as to improve adhesion property and uniformity of film quality. Therefore, deposition on a polymer film (e.g., an acrylic resin or an epoxy resin) has hitherto hardly ever been performed.

As an exemplary embodiment, titanium layer 124B, titanium nitride layer 124C, and the like are formed by performing sputtering intermittently without heating the substrate (the material on which the layer is to be formed) while changing the sputtering region (the region on which the sputtered substance is to be deposited). The respective layers are analyzed by XRD (X-ray diffraction). In consideration of the ease in attachment to an X-ray diffraction apparatus and in peak detection, a sample obtained by deposition on a glass substrate is used for the analysis by XRD (X-ray diffraction analysis). The sputtering apparatus used is a high-rate sputtering apparatus (SH-450) manufactured by ULVAC Incorporated.

Figure 7:
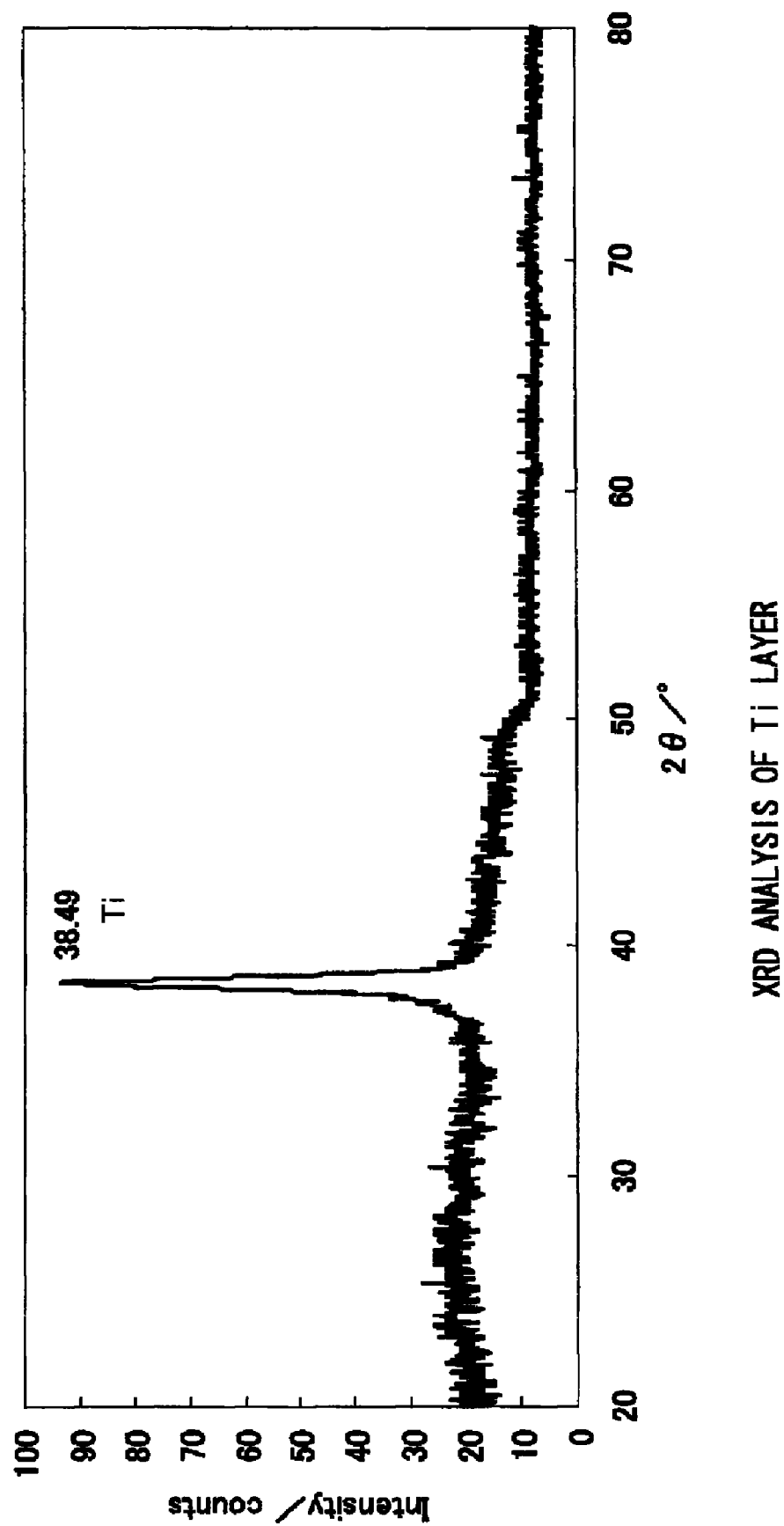
FIG. 7 is a chart showing an XRD (X-ray diffraction) analysis result when a titanium layer is deposited by sputtering without heating the material on which the layer is to be deposited.

Specifically, titanium (Ti) is deposited on the glass substrate to a thickness of 320 nm by a sputtering method using a titanium (Ti) target at a power of 350 W, a pressure of 0.3 Pa, and a deposition rate of 7 nm/min while introducing an argon (Ar) gas at a flow rate of 20 sccm and moving the glass substrate so as to rotate relative to the target (workpiece rotation rate: 2 revolutions/min) without heating the glass substrate. The result of an XRD (X-ray diffraction) analysis of the obtained titanium layer is shown in FIG. 7. A peak corresponding to titanium (Ti) is observed in FIG. 7, indicating the formation of a titanium layer.

Figure 8:
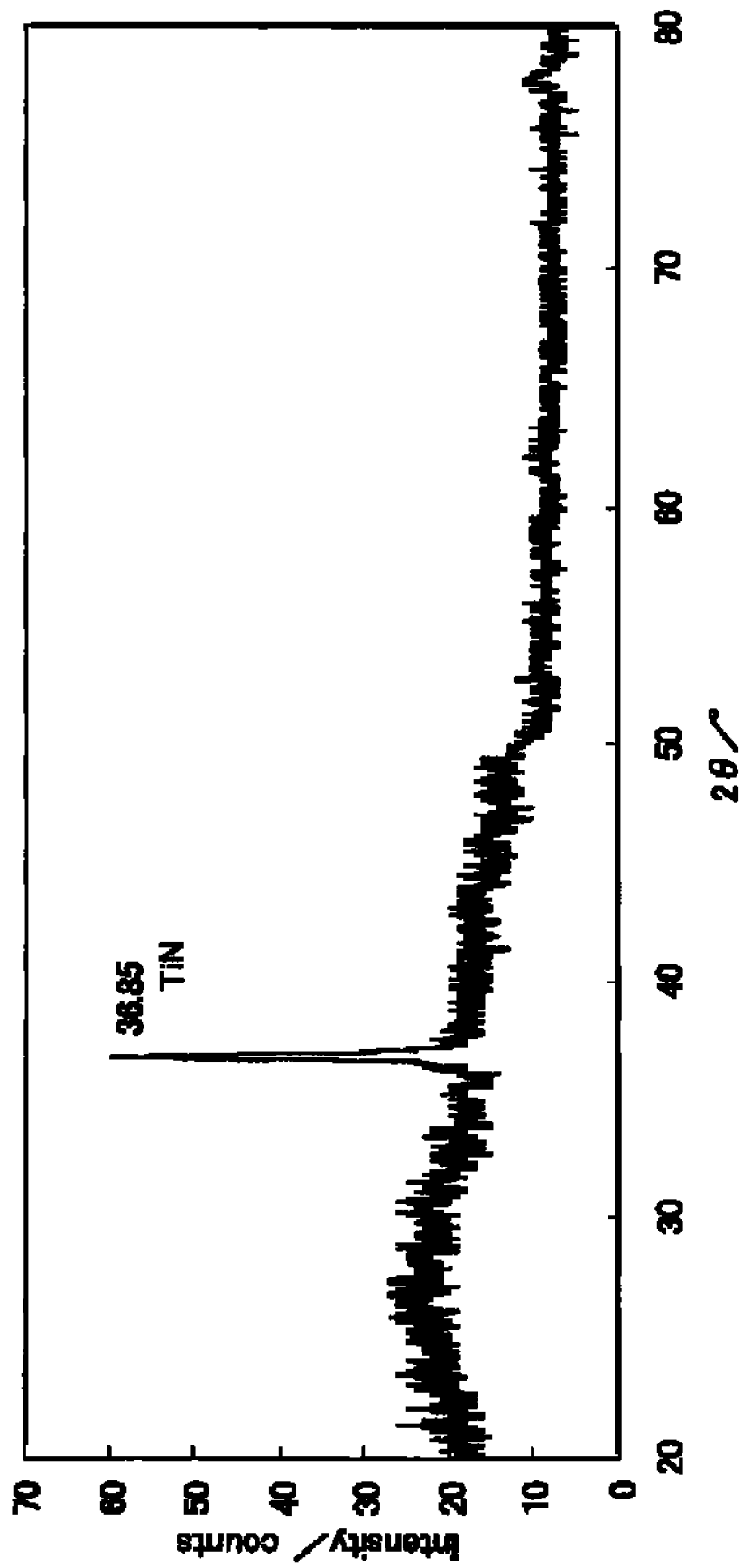
FIG. 8 is a chart showing an XRD (X-ray diffraction) analysis result when a titanium nitride layer is deposited by sputtering without heating the material on which the layer is to be deposited.

Similarly, titanium nitride (TiN) is deposited on the glass substrate to a thickness of 236 nm by a sputtering method using a titanium (Ti) target at a power of 350 W, a pressure of 0.3 Pa, and a deposition rate of 2.8 nm/min while introducing an argon (Ar) gas at a flow rate of 18 sccm and a nitrogen ($N_2$) gas at a flow rate of 2 sccm and moving the glass substrate so as to rotate relative to the target (workpiece rotation rate: 2 revolutions/min) without heating the glass substrate, the rate of the argon gas flow rate to the nitrogen gas flow rate being 9:1. The result of an XRD (X-ray diffraction) analysis of the obtained titanium nitride layer is shown in FIG. 8. The peak at a $2\theta$ value corresponding to Ti observed in FIG. 7 is not observed in FIG. 8, while a peak corresponding to TiN is observed in FIG. 8, indicating the formation of a titanium nitride (TiN) layer.

Figure 9:
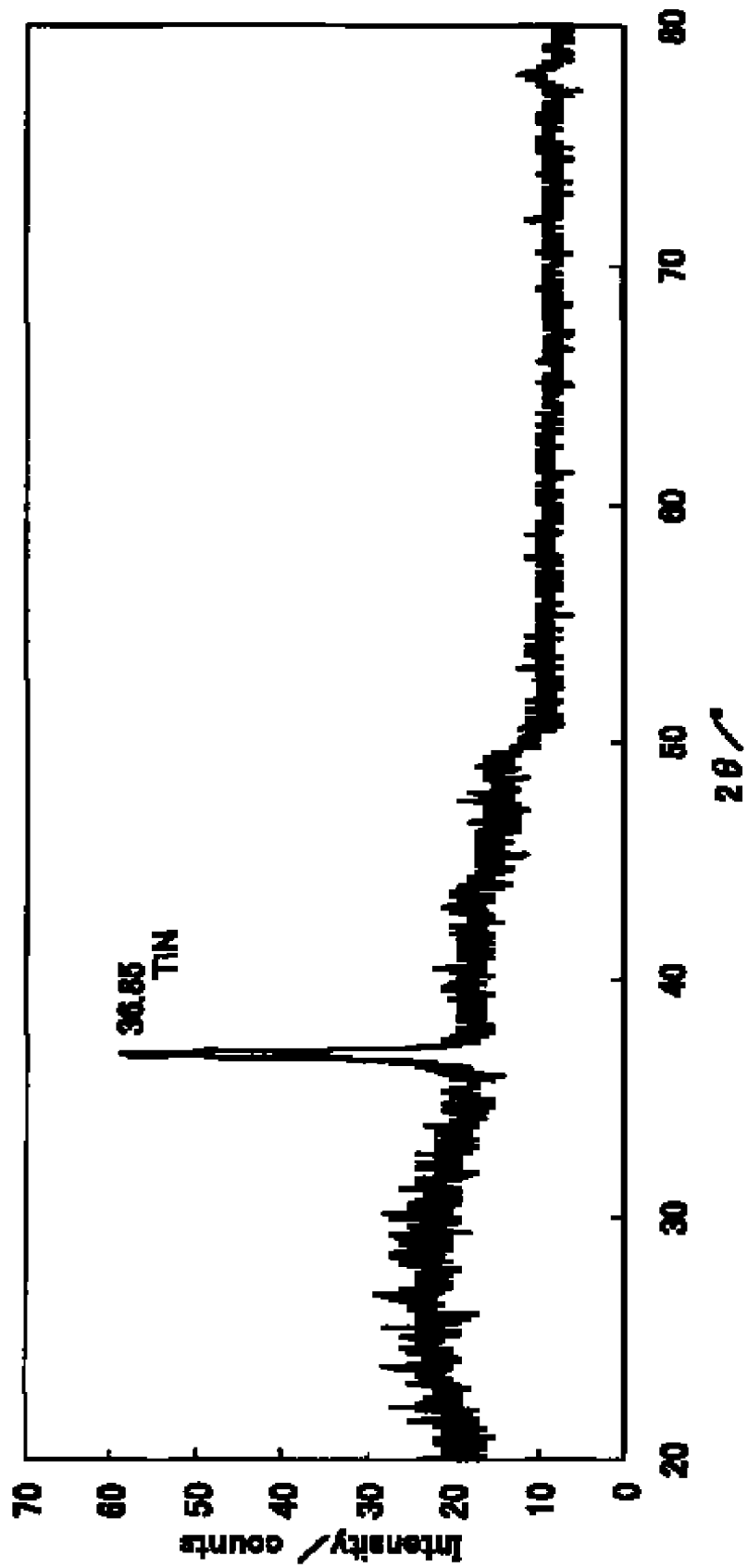
FIG. 9 is a chart showing an XRD (X-ray diffraction) analysis result when a titanium nitride layer is deposited by sputtering while the material on which the layer is to be deposited is heated.

For comparison, a titanium nitride (TiN) is deposited on the glass substrate to a thickness of 236 nm by a sputtering method in the same manner as described above, except that, during the deposition, the glass substrate is heated at 200° C. The result of an XRD (X-ray diffraction) analysis of the obtained titanium nitride layer is shown in FIG. 9. As in FIG. 8, the peak corresponding to TiN is observed in FIG. 9, indicating that a titanium nitride (TiN) layer is formed that has hardly any film property difference from the titanium nitride (TiN) layer obtained by deposition in which the glass substrate is not heated.

Figure 10:
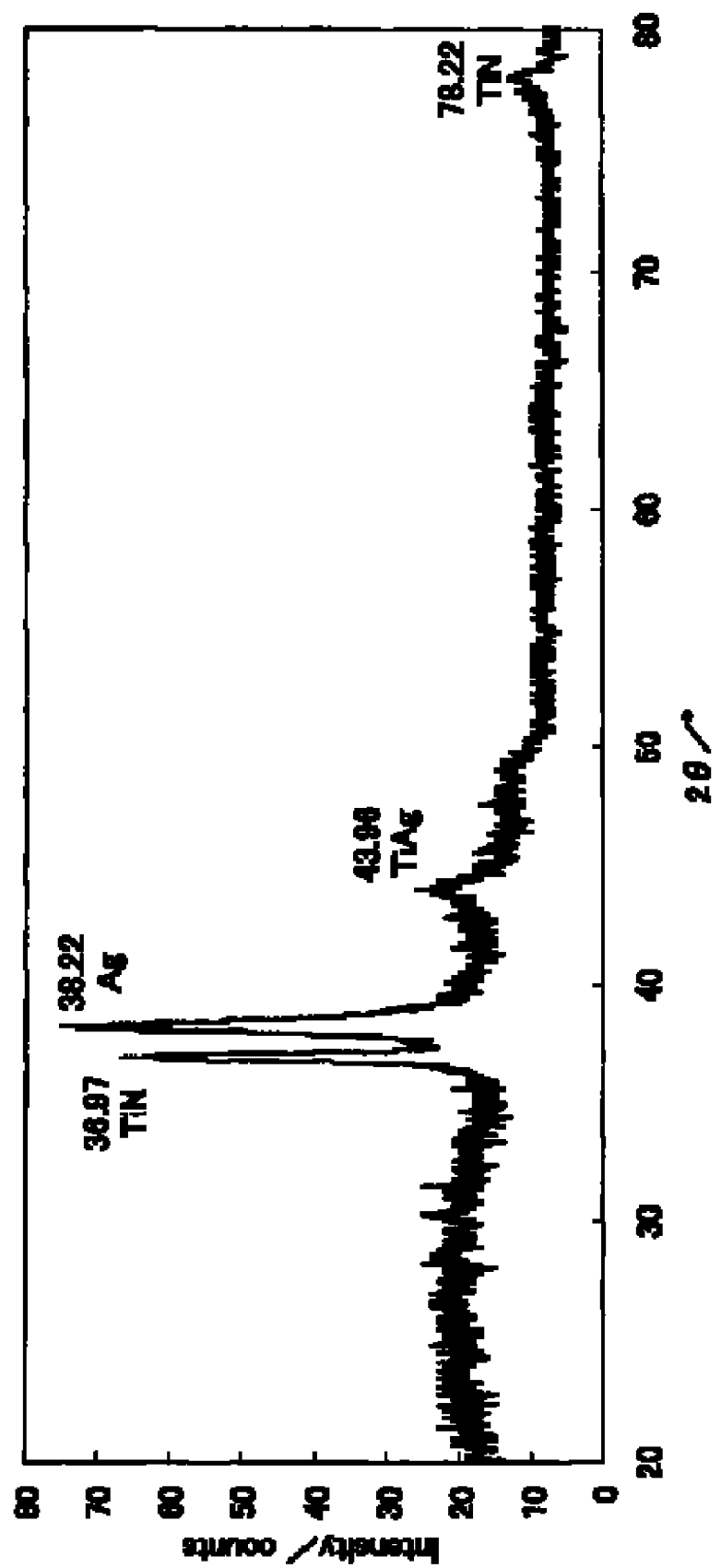
FIG. 10 is a chart showing an XRD (X-ray diffraction) analysis result when a silver alloy layer, a titanium layer and a titanium nitride layer are sequentially deposited by sputtering without heating the material on which the layers are to be deposited.

In addition, a silver alloy (silver alloy No. 37 manufactured by Mitsubishi Materials Corporation) is deposited on the glass substrate to a thickness of 100 nm by a sputtering method using a target formed of the silver alloy without heating the glass substrate, while moving the glass substrate so as to rotate relative to the target (workpiece rotation rate: 2 revolutions/min). Then, titanium (Ti) is deposited on the glass substrate to a thickness of 20 nm by a sputtering method using a titanium (Ti) target at a power of 350 W, a pressure of 0.3 Pa, and a deposition rate of 7 nm/min while introducing an argon (Ar) gas at a flow rate of 20 sccm and rotating the glass substrate in the manner described above without heating the glass substrate. Then, titanium nitride (TiN) is deposited on the titanium layer to a thickness of 236 nm by introducing an argon (Ar) gas at a flow rate of 18 sccm and a nitrogen ($N_2$) gas at a flow rate of 2 sccm, the rate of the argon gas flow rate to the nitrogen gas flow rate being 9:1. The result of an XRD (X-ray diffraction) analysis of the obtained layers is shown in FIG. 10. A peak corresponding to a titanium-silver alloy (Ti—Ag) is observed in FIG. 10, together with the respective peaks corresponding to the silver alloy, titanium, and titanium nitride. Therefore, it is found that a titanium-silver alloy layer is disposed between the silver alloy layer and the titanium layer.

As described above, in the present exemplary embodiment, specific methods (such as the above methods (1) and (2)) may be used in sputtering to suppress deterioration (damaging) of polymer film 10A (optical waveguide film main body 116) due to heating of polymer film 10A (optical waveguide film main body 116) or radiation heat. In other words, protective layer 124 may be formed by a sputtering method while suppressing the film deterioration caused by heat. Consequently, in the exemplary embodiment, the electric wiring portions (and mirror layer 118) and protective layer 120 having the specific layer configuration can be formed while suppressing the deterioration of optical waveguide film 10 caused by heat.

In the present exemplary embodiment, since mask 126 is used when deposition is conducted by a sputtering method to sequentially form electric wiring portions (and mirror layer 118) and protective layer 124 (in other words, since patterning of the respective layers is performed using mask 126), protective layer 124 is formed to cover the principal surfaces of the electric wiring portions (and the principal surface of mirror layer 118) as well as the side surfaces thereof. Therefore, exposure of the electric wiring portions (and mirror layer 118) is suppressed, whereby deterioration is suppressed compared with, for example, when cutting for patterning with a dicing saw, by which side surfaces of electric wiring portions 120 are exposed, is performed.

Figure 11:
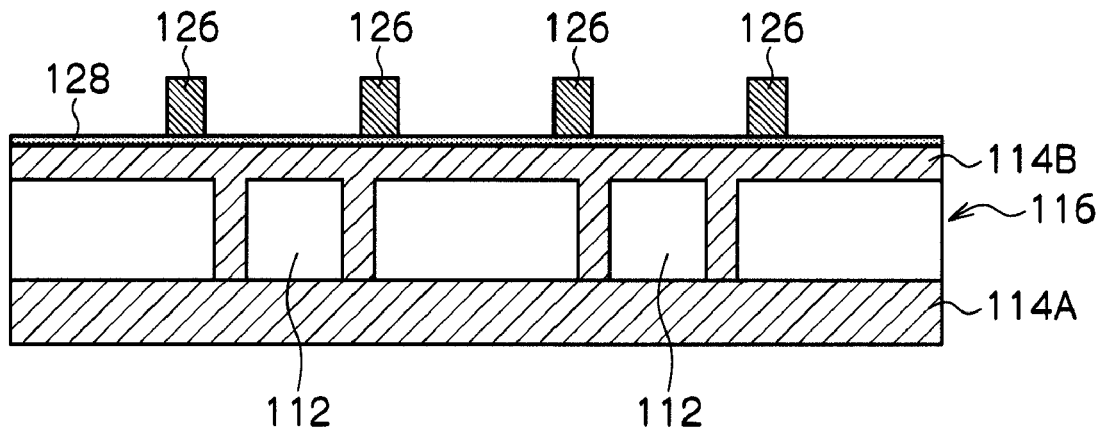
FIG. 11 is a schematic diagram showing a state in which a mask is provided on an optical waveguide film main body with an attachment layer therebetween in a method of producing an optical waveguide film according to an exemplary embodiment.
Figure 12:
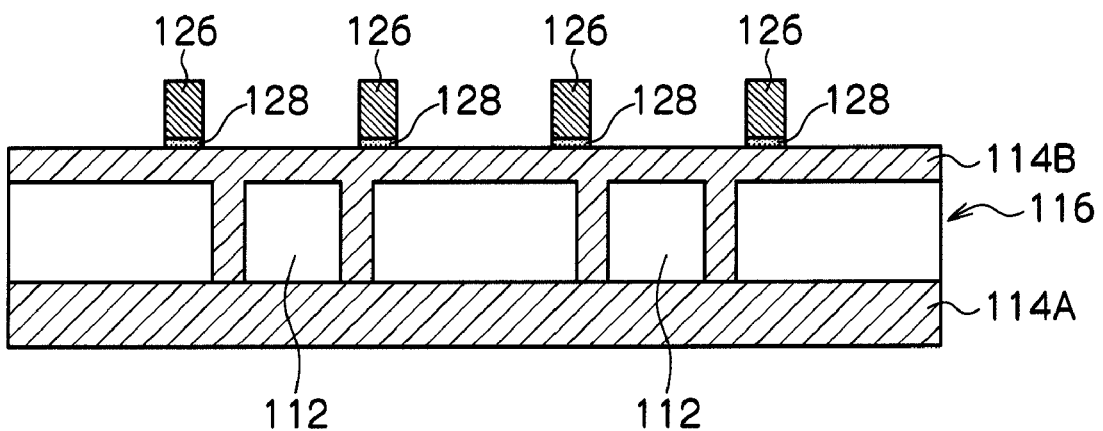
FIG. 12 is a schematic diagram showing a state in which a mask is provided on an optical waveguide film main body with an attachment layer therebetween in a method of producing an optical waveguide film according to an exemplary embodiment.

Although a configuration in which mask 126 is disposed directly on a principal surface of optical waveguide film main body 116 is described, the manner in which mask 126 is disposed is not limited thereto. For example, as shown in FIGS. 11 and 12, mask 126 may be disposed on at least a part of a principal surface of optical waveguide film main body 116 with attachment layer 128 interposed between mask 126 and the principal surface of optical waveguide film main body 116. The presence of attachment layer 128 prevents a space from being left between mask 126 (particularly in the case of a metal mask) and optical waveguide film main body 116, so that entry of components of electric wiring portions into the space is also prevented when forming the electric wiring portions. When electric wiring portions are formed by a sputtering method, the components for forming the electric wiring portions more easily enter the space than when a vapor deposition method is used; therefore, providing attachment layer 128 is particularly effective when electric wiring portions are formed by a sputtering method. As a result, deterioration or distortion of the shapes of the electric wiring portions is suppressed.

Attachment layer 128 is not particularly limited as long as mask 126 is temporarily adhered to optical waveguide film main body 116 by attachment layer 128 with substantially no space therebetween. Attachment layer 128 may be, for example, a resin layer (for example, a silicone grease layer) or an adhesive layer (for example, a dual-sided adhesive tape). Attachment layer 128 is preferably an adhesive layer that adheres to one of mask 126 or optical waveguide film main body 116 but does not adhere to the other one of mask 126 or optical waveguide film main body 116; such an adhesive layer improves adhesiveness and, further, makes it easy to peel mask 126 from optical waveguide film main body 116.

When attachment layer 128 adheres to optical waveguide film main body 116 but does not adhere to mask 126, the material of attachment layer 128 (adhesive layer) preferably includes, for example, at least one of an acrylic adhesive, an epoxy adhesive, or an addition-curable silicone adhesive. When the adhesive is an addition-curable adhesive made of a resin belonging to the same class as that of the material of the optical waveguide film, the adhesive generally easily adheres to optical waveguide film main body 116, but generally hardly adheres to mask 126 (especially when mask 126 is a metal mask); therefore, such an addition-curable adhesive is preferable as a component of attachment layer 128.

When attachment layer 128 adheres to optical waveguide film main body 116, the material for forming attachment layer 128 is preferably a curable resin (adhesive) that is similar to the curable resin for forming cladding, considering that attachment layer 128 remains on optical waveguide film main body after mask 126 is peeled off.

When attachment layer 128 (adhesive layer) adheres to mask 126 but does not adhere to optical waveguide film main body 116, the material for forming attachment layer 128 may be, for example, a silicone resin (particularly, a moisture-curing silicone adhesive). The moisture-curing silicone adhesive generally adheres to both resin and metal; however, since its curing reaction starts from a surface, when the moisture-curing silicone adhesive is attached to a mask and gets into a semi-cured state in which curing has partially proceeded, its power of adhering to another material is greatly decreased. Therefore, the moisture-curing silicone adhesive is preferable as a material for forming attachment layer 128, considering that the adhesive can be easily controlled to have such a property that the adhesive adheres to mask 126 but does not adhere to optical waveguide film main body 116.

The method of forming attachment layer 128 may specifically be a method including, as shown in FIG. 11, providing a curable adhesive on a principal surface of the obtained optical waveguide film main body 116, and then disposing mask 126, and then curing the curable adhesive to form attachment layer 128. As a result, attachment layer 128 adheres to optical waveguide film main body 116 but does not adhere to mask 126 (particularly when mask 126 is a metal mask), so that adhesiveness is easily ensured and mask 126 can still be easily peeled after formation of electric wiring portions.

As shown in FIG. 12, for example, a curable silicone resin may be applied to mask 126 and cured to form attachment layer 128 in advance, and then mask 126 may be disposed on a principal surface of optical waveguide film main body 116 such that attachment layer 128 contacts optical waveguide film main body 116. In other words, a mask may be provided with attachment layer 128 in advance, and then the mask having attachment layer 128 may be disposed on optical waveguide film may body 116. As a result, attachment layer 128 does not adhere to optical waveguide film main body 116 but adheres to mask 126 (particularly when mask 126 is a metal mask), so that mask 126 can be easily peeled after formation of electric wiring portions.

The material for forming attachment layer 128 is preferably a curable material. For example, adhesiveness may be more easily obtained by curing a curable material to form attachment layer 128, as in processes shown in FIGS. 11 and 12. As a result, deterioration or distortion of the shapes of the electric wiring portions (metal layer) may be suppressed, compared with a case in which other kinds of material are used to form the attachment layer.

The material forming attachment layer 128 preferably includes a UV-curable resin. For example, as in a configuration shown in FIG. 11, when a coating layer formed of a UV-curable resin is formed on a principal surface (for example, the entire surface of a principal surface) of optical waveguide film main body 116 and then mask 126 is disposed on the coating layer and, further, UV rays are irradiated from the upper side (upper side of mask 126), the coating layer formed of a UV-curable resin in a region that is exposed at an opening of mask 126 is cured while the coating layer formed of a UV-curable resin in a region that is covered with mask 126 remains uncured, so that adhesiveness can be easily ensured while mask 126 can easily be peeled from optical waveguide film main body 116. This process is effective when a curable resin that adheres to both of mask 126 and optical waveguide film main body 116 is used as a material forming attachment layer 128.

The thickness of attachment layer 128 may be, for example, from 10 μm to 100 μm, and is preferably smaller than the thickness of mask 126. For example, mask 126 for forming a thin-line pattern usually has a thickness of about 100 μm, in which case, the thickness of attachment layer 128 is preferably from 20 μm to 50 μm. The viscosity of a curable resin coating liquid for forming attachment layer 128 may be, for example, from 0.5 Pa·s to 5 Pa·s. The method of applying the curable resin coating liquid is not particularly limited. For example, when the curable resin coating liquid is applied to mask 126 in advance, it is preferable to adopt a stamping method, which involves a transfer process.

A release layer may be formed between mask 126 and attachment layer 128. Independently therefrom, a release layer may be formed between optical waveguide film main body 116 and attachment layer 128. Due to the presence of the release layer(s), peeling of mask 126 from optical waveguide film main body 116 may be made easier, regardless of what material forms attachment layer 128. Examples of the material for forming a release layer include a silicone lubricant and a fluorine-containing lubricant.

Optical Transmitter and Receiver Module

Figure 13:
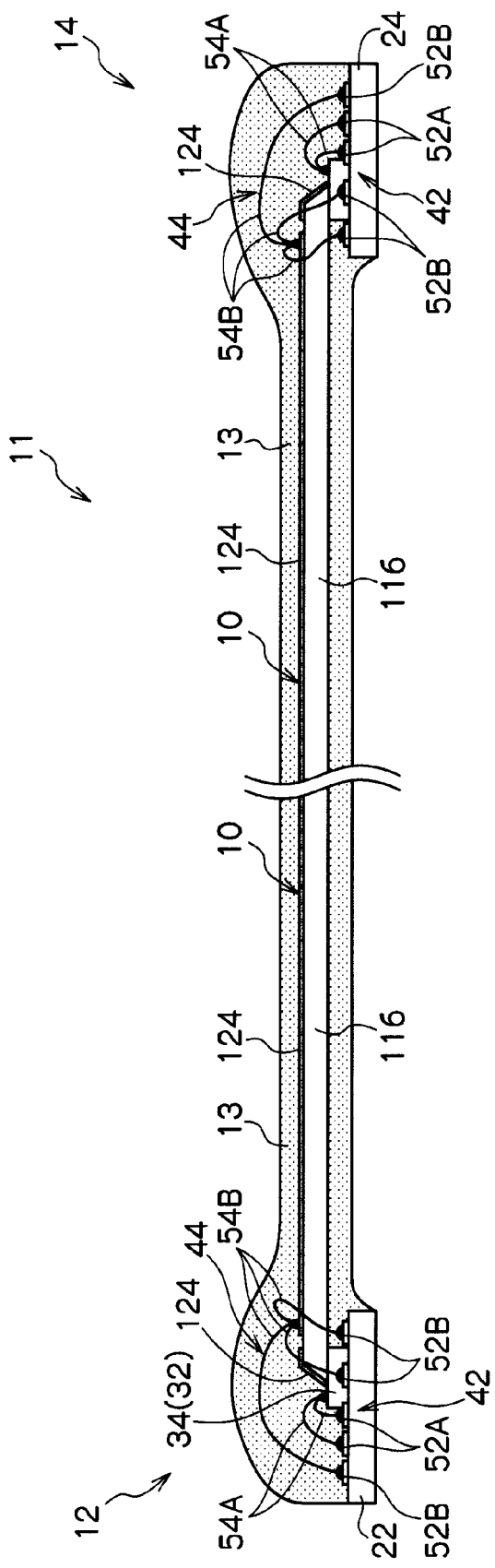
FIG. 13 is schematic side view of an optical transmitter and receiver module according to an exemplary embodiment.
Figure 14:
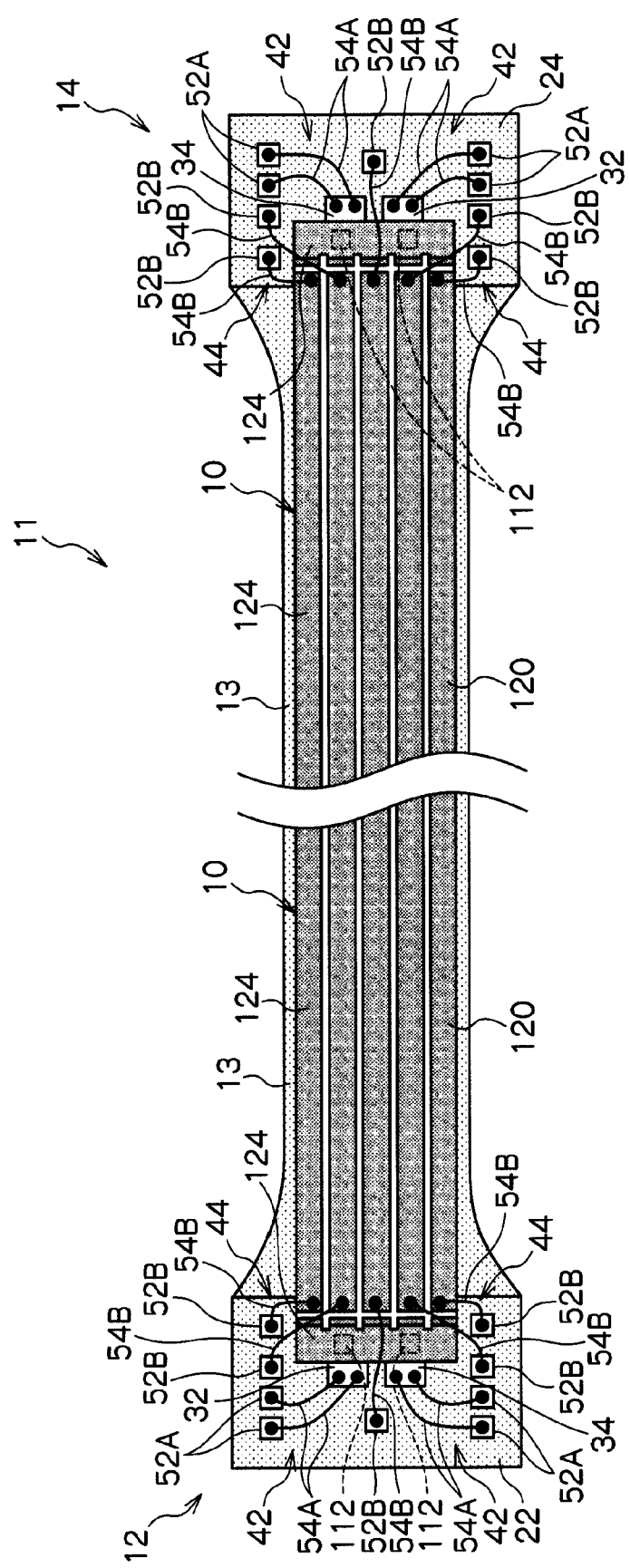
FIG. 14 is schematic side view of an optical transmitter and receiver module according to an exemplary embodiment.

FIG. 13 is a schematic side view of an optical transmitter and receiver module according to an exemplary embodiment. FIG. 14 is a schematic plan view of an optical transmitter and receiver module according to an exemplary embodiment. Optical transmitter and receiver module 11 according to the present exemplary embodiment includes, as shown in FIGS. 13 and 14, belt-shaped optical waveguide film 10 and optical transmitter and receiver sections 12 and 14 that transmit and receive optical signals via an optical waveguide formed in optical waveguide film 10. As the optical waveguide film 10, the optical waveguide film 10 according to the aforementioned exemplary embodiments is applied.

Optical transmitter and receiver section 12 includes holding member 22, and one end portion of optical waveguide film 10 is held on holding member 22. Optical transmitter and receiver section 14 includes holding member 24, and the other end portion of optical waveguide film 10 is held on holding member 24.

Holding member 22 and holding member 24 are each provided with light-receiving element 34, light-emitting element 32, wire connecting section 42 for transmitting and receiving a signal by the light-receiving and light-emitting elements, and wire connecting section 44 for electrical connection to electric wiring portions 120 of optical waveguide film 10. Although not illustrated in the drawings, at least one of a driving circuit for light-receiving element 34 and light-emitting element 32 or an amplification circuit for light-receiving element 34 and light-emitting element 32 may also be provided.

At each wire connecting section 42 for transmitting and receiving a signal by the light-receiving and light-emitting elements, light-receiving element 34 and light-emitting element 32 are connected by wires 54A to electrodes 52A provided at each of holding member 22 and 24 (in the present exemplary embodiment, two electrodes 52 are provided at each holding member), in order to allow, from outside of the module, amplification of a signal transmitted and received by the light-receiving and light-emitting elements and driving of the light-receiving and light-emitting elements.

At each wire connecting section 44 for providing electrical connection to electric wiring portions 120 of optical waveguide film 10, end portions of electric wiring portions 120 at one end thereof are connected by wires 54B to electrodes 52B provided at each of holding member 22 and 24 (in the present exemplary embodiment, five electrodes are provided at each holding member since there are five electric wiring portions 120), in order to connect electric wiring portions 120 to the outside of the module, for power supply, electric signal transmission and reception, grounding, and the like.

A flame-retardant resin covers optical waveguide film 10 provided at optical transmitter and receiver module 11 and also covers light-receiving element 34, light-emitting element 32, wire connecting section 42, and wire connecting section 44 provided at each of holding member 22 and holding member 24. A flame-retardant resin layer 13 is formed at a surface of these elements. Flame-retardant resin layer 13 covers electric wiring portions 120 disposed at optical waveguide film 10, and functions as a protective layer for electric wiring portions 120.

In the present exemplary embodiment, the state of being covered with a flame-retardant resin is a state in which flame-retardant resin layer 13 made of a flame-retardant resin is formed on an element to be covered so that the element to be covered does not contact the outside air.

In the present exemplary embodiment, a configuration is described in which all of optical waveguide film 10 and light-receiving element 34, light-emitting element 32, wire connecting section 42, and wire connecting section 44 provided at each of holding member 22 and holding member 24 are covered with a flame-retardant resin.

Although a configuration in which a flame-retardant resin covers optical waveguide film 10 as well as all of light-receiving element 34, light-emitting element 32, wire connecting section 42, and wire connecting section 44 provided at each of holding member 22 and holding member 24 is most preferable from the viewpoint of improving the flame-retardancy of optical transmitter and receiver module 11, possible configurations are not limited thereto. A configuration in which at least optical waveguide film 10 is covered with a flame-retardant resin is preferable, and a configuration in which optical waveguide film 10 and at least one of light-receiving element 34, light-emitting element 32, wire connecting section 42, or wire connecting section 44 provided at each of holding member 22 and holding member 24 are covered with a flame-retardant resin is more preferable.

The flame-retardant resin used in the present exemplary embodiment is a resin whose flame-retardancy according to the UL-94 test (which is incorporated herein by reference) is HB or higher and which has such a property that optical waveguide film 10 having flame-retardant resin layer 13 on a surface thereof has a minimum bend radius of from 1 mm to 3 mm or from about 1 mm to about 3 mm, flame-retardant resin layer 13 being formed by coating the surface with the resin.

The UL94 test of a flame-retardant resin is a known flame test in which a test piece in a form of a strip having a width of 13.0 mm, a length of 125 mm, and a thickness of 100 μm, which is the minimum thickness practically possible, is exposed to a gas burner flame in a vertical flame test or a horizontal flame test and the degree of combustion of the test piece is observed. The flame retardancy of general materials according to the UL94 is classified into 5VA, 5VB, V-0, V-1, V-2, and HB in the order from the highest flame-retardancy to the lowest flame retardancy. The flame-retardant resin used in the present exemplary embodiment shows a flame-retardancy according to the UL94 test of HB or higher, preferably V-2 or higher, and still more preferably V-0 or higher, when a flame-retardant resin layer made of the flame-retardant resin is tested.

As a flame-retardant resin having the property described above, a resin containing a dimethylpolysiloxane (HO—[Si(CH$_3$)$_2$O]N—H) having a polymerization degree of from 200 to 1,000 as a main component is used in the present exemplary embodiment. The flame-retardant resin containing the dimethylpolysiloxane as a main component is a resin containing the dimethylpolysiloxane at 30% by weight or more.

Dimethylpolysiloxanes produced by a usual production process are known to contain a trace amount of cyclic dimethylpolysiloxanes, which are non-reactive and volatile and may cause electric connection failure.

Therefore, in the flame-retardant resin used in the present exemplary embodiment, the content of low-molecular-weight siloxane in which the amount of cyclic dimethyl siloxane (D unit) is from D3 (trimer) to D20 (icosamer) is 500 ppm or less or about 500 ppm or less, and more preferably 300 ppm or less or about 300 ppm or less.

The flame-retardant resin preferably contains a filler having flame-retardancy (flame-retardant filler). Examples of the flame-retardant filler include titanium oxide, silicon oxide, and aluminum oxide.

When the flame-retardant resin contains the flame-retardant filler, the amount of the flame-retardant filler to be mixed with 100 parts by weight of the dimethylpolysiloxane is preferably within a range of form 1 part by weight to 70 parts by weight.

The flame-retardant resin may be applied to the respective members to be covered, and then cured by being left at room temperature or by being heated, so as to form flame-retardant resin layer 13 on surfaces of the respective members. The application of the flame-retardant resin may be performed using, for example, a dispenser. Therefore, the viscosity of the flame-retardant resin at the time of application may be sufficiently low, specifically from 1 Pa·s to 30 Pa·s or from about 1 Pa·s to about 30 Pa·s, and more preferably from 2 Pa·s to 20 Pa·s or from about 2 Pa·s to about 20 Pa·s.

A solvent may be added to a coating liquid for forming flame-retardant resin layer 13 in order to control the viscosity; the amount of the solvent may be such an amount that adverse effects due to the addition of the solvent are not produced.

The thickness of flame-retardant resin layer 13, which may be produced by applying a flame-retardant resin to respective members and curing the flame-retardant resin, may be from 20 µm to 100 µm or from about 20 µm to about 100 µm, and preferably from 30 µm to 80 µm or from about 30 µm to about 80 µm, at a straight-line portion which should have bending property. At holding members 22 and 24, which need not have bending property, all of the connection wires of wiring electrodes are preferably covered with a flame-retardant resin, so that the thickness of the flame-retardant resin layer is determined on a case-by-case basis.

The tensile strength of flame-retardant resin layer 13 may be from 0.5 MPa to 5 MPa or from about 0.5 MPa to about 5 MPa, and preferably from 1.0 MPa to 4.0 MPa or from about 1.0 MPa to about 4.0 MPa.

The tensile strength and viscosity mentioned above are measured according to a known testing method for uncured and cured silicone rubber described in JIS-K6249, which is incorporated herein by reference.

The minimum bend radius of optical waveguide film 10 whose surface has flame-retardant resin layer 13 formed by coating with a flame-retardant resin may be from 1 mm to 3 mm or from about 1 mm to about 3 mm. The thickness of optical waveguide film 10 covered with a flame-retardant resin is preferably from 50 µm to 500 µm, and more preferably from 100 µm to 300 µm, from the viewpoint of improving the flexibility of optical waveguide film 10. From a similar viewpoint, the width of optical waveguide film 10 covered with a flame-retardant resin is preferably from 0.25 mm to 10 mm, and more preferably from 0.3 mm to 3 mm. In this case, the thickness of optical waveguide film 10 before being coated with a flame-retardant resin is preferably from 60 µm to 100 µm.

Next, the structure of optical transmitter and receiver section 12 having holding member 22 will be described. Since holding member 24 has the same structure as that of holding member 22 and optical transmitter and receiver section 14 has the same structure as that of optical transmitter and receiver section 12, descriptions of holding member 24 and optical transmitter and receiver section 14 are omitted.

Holding member 22 is formed of a substrate having a substantially rectangular-parallelepiped shape. Light-receiving element 34, light-emitting element 32, wire connecting section 42, and wire connecting section 44 are provided at holding member 22.

In the exemplary embodiment, an optical waveguide used to transmit an optical signal from optical transmitter and receiver section 12 is called an optical waveguide for transmission of the signal, and an optical waveguide used to receive an optical signal from optical transmitter and receiver section 12 is called an optical waveguide for receiving the signal. However, when these optical waveguides are considered in terms of the function of optical transmitter and receiver section 14, the optical waveguide for transmission of the signal and the optical waveguide for receiving the signal are reversed.

In optical transmitter and receiver section 12, for example, light-emitting element 32 and light-receiving element 34 are mounted on holding member 22 by using a flip chip bonder or the like. Next, optical waveguide film 10 is mounted on light-emitting element 32 and light-receiving element 34 by using a flip chip bonder. As a result, optical waveguide film 10 is held by holding member 22 (and holding member 24). Then, light-emitting element 32 and light-receiving element 34 are connected to electrodes 52A by wires 54A.

An end portion at one end of each electric wiring portion 120 is connected to its corresponding electrode 52B by wire 54B.

Further, a flame-retardant resin is applied, using a dispenser, to surfaces of optical waveguide film 10 and light-emitting element 32, light-receiving element 34, wire connecting section 42, and wire connecting section 44 implemented or held on each of holding member 22 and holding member 24, so that flame-retardant resin layer 13 made of the flame-retardant resin is formed on the surfaces. The application using a dispenser may be conducted in a state in which the module is fit into a template having a groove.

Through the above process, optical transmitter and receiver module 11 according to the present exemplary embodiment is produced in which the surfaces of light-emitting element 32, light-receiving element 34, wire connecting section 42, and wire connecting section 44, and optical waveguide film 10, as components of optical transmitter and receiver module 11, are covered with a flame-retardant resin.

Next, an operation of optical transmitter and receiver module 11 according to the exemplary embodiment will be described. In the description given herein, an optical waveguide for transmission of an optical signal refers to an optical waveguide to which optical transmitter and receiver section 12 transmits an optical signal, and an optical waveguide for receiving an optical signal refers to an optical waveguide from which optical transmitter and receiver section 12 receives an optical signal.

In the optical transmitter and receiver module according to the exemplary embodiment, when an optical signal is transmitted from optical transmitter and receiver section 12 to optical transmitter and receiver section 14, light emitted from light-emitting element 32 held by holding member 22 of optical transmitter and receiver section 12 enters an optical waveguide core 112 of the optical waveguide for transmission of the signal from an incident end surface of the optical waveguide core 112, and is transmitted through the optical waveguide for transmission of the signal formed in optical waveguide film 10; the light coming out of the outputting end surface of the optical waveguide core 112 of the optical waveguide for transmission is received by light-receiving element 34 held by holding member 24 of optical transmitter and receiver section 14.

Similarly, when an optical signal transmitted from optical transmitter and receiver section 14 is received by optical transmitter and receiver section 12, light emitted from light-emitting element 32 held by holding member 24 of optical transmitter and receiver section 14 enters an optical waveguide core 112 of the optical waveguide for receiving the signal from an incident end surface (mirror surface 116A) of the optical waveguide core 112, and is transmitted through the optical waveguide for receiving the signal formed in optical waveguide film 10. Then, the light coming out of the outputting end surface (mirror surface 116A) of the optical waveguide core 112 of the optical waveguide for receiving the signal is received by light-receiving element 34 held by holding member 22 of optical transmitter and receiver section 12.

Together with the optical transmission and reception, electric processes are also performed through electric wiring portions 120 provided on optical waveguide film 10, such as power supply, transmission and reception of electric signals, and grounding.

In the aforementioned exemplary embodiment, a description was given of an optical transmitter and receiver module that conducts two-way optical communication between the optical transmitter and receiver sections each having both of a light-emitting element and a light-receiving element mounted thereon. However, the module may alternatively be an optical transmitter and receiver module in which one-way optical communication is carried out between an optical transmitter section having a light-emitting element and an optical receiver section having a light-receiving element.

The foregoing description of the exemplary embodiments of the present invention has been provided for the purposes of illustration and description. It is not intended to be exhaustive or to limit the invention to the precise forms disclosed. Obviously, many modifications and variations will be apparent to persons skilled in the art. The embodiments were chosen and described in order to best explain the principles of the invention and its practical applications, thereby enabling others skilled in the art to understand the invention for various embodiments and with the various modifications as are suited to the particular use contemplated. It is intended that the scope of the invention be defined by the following claims and their equivalents.

EXAMPLES

The present invention is described specifically below by way of examples. However, the examples should not be construed as limiting the invention.

Example 1

Preparation of Optical Waveguide Film Main Body

First, an epoxy film having high refractive index (thickness: 50 µm, refractive index: 1.57) for forming a core is prepared. Then, an epoxy UV-curable resin having a refractive index of 1.51 is applied, in a thickness of 20 µm, to both surfaces of the epoxy film by spin coating, and is cured by irradiation with UV rays, thereby providing a three-layered film.

Then, the three-layered film is attached to a dicing saw (DAD321 (tradename) manufactured by DISCO Corporation), and is cut with the dicing saw equipped with a 100 µm-thick blade from the principal surface (the top surface) side to a depth of 75 µm±5 µm ("5 µm" representing the cutting accuracy). Then, the cutting position is shifted by 50 µm in the width direction, and cutting is performed again. As a result, a 50 µm-square-shaped core is formed. Thereafter, the cutting position is shifted by 450 µm in the width direction, and cutting is performed again. Further, the cutting position is shifted by 50 µm in the width direction, and cutting is performed again. In this way, two 50 µm-square-shaped cores are formed at a pitch (between the cores) of 500 µm.

Thereafter, an epoxy UV-curable resin having a refractive index of 1.51 is applied to fill the grooves formed by the cutting. Then, UV rays are irradiated to cure the resin, thereby providing a belt-shaped optical waveguide film having a width of 1.0 mm and a thickness of 90 µm.

Then, a dicing saw having a 45°-angled blade for Si is used to cut the both ends of the optical waveguide film at an angle of 45° with respect to the optical axis, whereby a 45°-mirror surface is formed at each end and the cores are exposed at the mirror surface. In this way, an optical waveguide film main body is obtained.

Formation of Electric Wiring Portion and Protective Layer on Optical Waveguide Film Main Body Thereafter, a mask composed of a grid-shaped frame (an electroformed Ni metal mask) is disposed at the upper surface of the obtained optical waveguide film main body except for the inclined surfaces (see FIG. 5).

Thereafter, sputtering using a silver alloy target (Ag alloy No. 37 manufactured by Mitsubishi Materials Corporation) is performed while the optical waveguide film main body is still attached to a dicing tape, so that a silver alloy layer having a thickness of 1.0 µm is formed on the upper surface of the optical waveguide film main body (including the 45°-inclined surfaces but excluding the regions covered by the mask). Specifically, in the sputtering, a high-rate sputtering apparatus (SH-450 (tradename) manufactured by ULVAC Incorporated) is used to deposit the silver alloy for 24 minutes at a power of 0.4 kW, an argon gas flow rate of 15 sccm, and a deposition pressure of 0.25 Pa while the workpiece (optical waveguide film main body) is rotated at 2 revolutions/minute without being heated, whereby the silver alloy layer (electric wiring portions and mirror layer) having a thickness of 1.0 µm is deposited on the inclined surfaces (in the case of mirror layers) and the upper surface (in the case of electric wiring portions) of the optical waveguide film main body.

Further, in the high-rate sputtering apparatus (SH-450) manufactured by ULVAC Incorporated, the silver alloy target is replaced by a titanium (Ti) target to perform sputtering so as to sequentially form a titanium (Ti) layer and a titanium nitride (TiN) layer, which serve as a protective layer.

Specifically, the formation of the Ti layer is conducted as follows: deposition is performed for 40 minutes at a power of 0.35 kW, an argon gas flow rate of 20 sccm, and a deposition pressure of 0.30 Pa while the workpiece (optical waveguide film main body) is rotated at a rate of 2 revolutions/minute without being heated, so as to form a Ti layer having a thickness of 200 nm that covers the silver alloy layer (electric wiring portions and mirror layers) of the optical waveguide film main body.

The formation of the TiN layer is conducted as follows: deposition is performed for 7 minutes using the same Ti target as above at a power of 0.35 kW, an argon gas flow rate of 18 sccm, a nitrogen gas flow rate of 2 sccm, and a deposition pressure of 0.30 Pa while the workpiece (optical waveguide film main body) is rotated at a rate of 2 revolutions/minute without being heated, so as to form a TiN layer having a thickness of 20 nm that covers the Ti layer on the optical waveguide film main body.

Since the high-rate sputtering apparatus (SH-450) manufactured by ULVAC Incorporated can accommodate four kinds of targets, the above three layers are formed in a series of operations without being exposed to the outside atmospheric air during the operations.

It is confirmed by an XRD (X-ray diffraction) analysis that the Ti layer has reacted with the silver alloy layer to form a titanium-silver alloy layer.

Then, the mask is removed from the optical waveguide main body. In the obtained film, the protective layer covers the optical waveguide film main body, a mirror layer formed of a silver alloy layer is formed, and the silver alloy layer formed on each mirror surface (inclined surface) of the optical waveguide film main body is separated from the silver alloy layer formed on the upper surface of the optical waveguide film main body by a distance of 53 µm (i.e., the width of a separation portion not having the Ag alloy layer between the silver alloy layer on the upper surface and the silver alloy layer on the mirror surface is 53 µm). The upper surface of the optical waveguide film main body is, in addition to being covered with the protective layer, provided with five lines of an electric wiring layer (five electric wiring portions) each having a width of 150 µm that extend from one end to the other end of the optical waveguide film main body in the longitudinal direction; the electric wiring portions are arranged with an interval of 200 µm therebetween in the width direction of the optical waveguide film main body. As a result, an optical waveguide film covered with a protective layer is obtained which has a mirror layer (silver alloy layer) having a thickness of 1.7 µm and five lines of an electric wiring layer (silver alloy layer) having a thickness of 1.7 μm, and which has a thickness of 90 μm, a length of 100 mm, and a width of 1 mm.

Evaluation of Optical Waveguide Film

A light from a LED light source having a wavelength of 850 nm is introduced into the optical waveguide via a multi-mode fiber having a core diameter of 50 μm, and the light leaving the optical waveguide is transmitted through a polymer cladding fiber having a core diameter of 200 μm and detected by a photo-diode, so as to calculate the insertion loss of the light and so as to evaluate the properties of the mirror layer. The calculated reflection loss is 0.3 dB, indicating excellent properties of the mirror layer. In order to evaluate long-term reliability, an accelerated test on the long-term reliability is performed by immersing the obtained optical waveguide film in a 5% by weight saline water for 24 hours; as a result, changes such as whitening due to chlorination are not at all observed at the mirror layer, indicating high long-term reliability. For the purpose of comparison, a sample having only the silver alloy layer (mirror layer) without the Ti/TiN layer is prepared and evaluated; as a result complete whitening is observed and the reflectance is greatly decreased in this sample.

Attachment to Module

A VCSEL device (AM-0001 (tradename) manufactured by Fuji Xerox Co., Ltd.) and a photodiode device (D8485-1026 (tradename) manufactured by EMCORE Corporation) are mounted on a 600-nm thick silicon substrate using a flip chip bonder, and the electrodes of the respective chips are connected to electrodes provided at the silicon substrate by using a wire bonder.

The optical waveguide film obtained above is mounted on the VCSEL device and the photodiode device by using a flip chip bonder. An epoxy UV-curable resin is used to adhere the optical waveguide film to the devices, and the epoxy UV-curable resin is cured by irradiation with UV rays. Finally, one end of each electric wiring portion on the optical waveguide film is connected to an electrode provided at the silicon substrate by using a wire bonder. In this way, an optical transmitter and receiver module is prepared.

Application of Flame-Retardant Resin

A one-component type condensation-curable silicone resin manufactured by Shin-Etsu Chemical Co., Ltd. is prepared as a flame-retardant resin. The properties of the flame-retardant resin used in Example 1 are as follows:

| | |
|---|---|
| Viscosity in an uncured state: | 20 Pa · s |
| Tensile strength: | 4.0 MPa |
| Content of low-molecular-weight siloxane in which the amount of cyclic dimethyl siloxane (D unit) is from D3 (trimer) to D20 (icosamer): | less than 300 ppm |
| Type of the flame-retardant filler: | silicon oxide and titanium oxide |
| Content of the flame-retardant filler: | 50% by weight |
| Flame-retardancy according to the UL94 test: | V-0 |

The flame-retardant resin is applied by using a coating robot (FAD320S (tradename) manufactured by Musashi Engineering Incorporated) so as to cover the surface of the optical waveguide film, the VCSEL device and photodiode device mounted on the substrate, and the connection sections (such as electrodes and wires) in the optical transmitter and receiver module prepared in Example 1. The applied flame-retardant resin is cured by being left at room temperature (25° C.) for 10 minutes.

The thickness of the flame-retardant resin layer formed by the curing of the applied flame-retardant resin is measured, and is found to be 0.2 mm.

The minimum bend radius of the optical waveguide film whose surface is covered with the flame-retardant resin is measured according to the ASTM D-2176, and is found to be 1.5 mm. Therefore, it is confirmed that a photoelectric-combined optical transmitter and receiver module having a simple structure, high flexibility, and superior flame-retardancy is provided.

Example 2

An optical waveguide film is prepared and evaluated in the same manner as in Example 1, except that, as the only protective layer, a titanium layer is formed as described below.

Formation of Protective Layer on Optical Waveguide Film Main Body

In the high-rate sputtering apparatus (SH-450) manufactured by ULVAC Incorporated, the silver alloy target is replaced by a titanium (Ti) target to perform sputtering so as to form a titanium (Ti) layer, which serves as a protective layer.

Specifically, the formation of the Ti layer is conducted as follows: deposition is performed for 90 seconds at a power of 0.35 kW, an argon gas flow rate of 20 sccm, and a deposition pressure of 0.30 Pa while the workpiece (optical waveguide film main body) is rotated at a rate of 2 revolutions/minute without being heated, so as to form a Ti layer having a thickness of 10 nm that covers the silver alloy layer (mirror layer) of the optical waveguide film main body.

Since the high-rate sputtering apparatus (SH-450) manufactured by ULVAC Incorporated can accommodate four kinds of targets, the above two layers are formed in a series of operations without being exposed to the outside atmospheric air during the operations.

It is confirmed by an XRD (X-ray diffraction) analysis that the Ti layer has reacted with the silver alloy layer to form a titanium-silver alloy layer.

Evaluation of Optical Waveguide Film

The properties of the mirror layer are evaluated in the same manner as in Example 1. The observed reflection loss is 0.3 dB, indicating excellent properties of the mirror layer. In order to evaluate long-term reliability, an accelerated test on the long-term reliability is performed by immersing the obtained optical waveguide film in a 5% by weight saline water for 24 hours; as a result, changes such as whitening due to chlorination are not at all observed at the mirror layer, indicating high long-term reliability. However, when the immersion time in the saline water is elongated to 36 hours in the accelerated test on long-term reliability, whitening due to chlorination is slightly observed at the mirror layer. It is thus found that the single layer of Ti can serve as a protective layer for protecting the silver alloy layer (mirror layer) even though the durability thereof is inferior to that of the protective layer in which the Ti layer and the TiN layer are both included. For the purpose of comparison, a sample having only the silver alloy layer (mirror layer) without the Ti layer is prepared and evaluated; as a result complete whitening is observed and the reflectance is greatly decreased in this sample.

Example 3

An optical waveguide film is prepared and evaluated in the same manner as in Example 1, except that, as the only protective layer, a titanium nitride layer is formed as described below.

Formation of Protective Layer on Optical Waveguide Film Main Body

In the high-rate sputtering apparatus (SH-450) manufactured by ULVAC Incorporated, the silver alloy target is replaced by a titanium (Ti) target to perform sputtering so as to form a titanium nitride (TiN) layer which serves as a protective layer.

Specifically, the formation of the TiN layer is conducted as follows: deposition is performed for 420 seconds using a Ti target at a power of 0.35 kW, an argon gas flow rate of 18 sccm, a nitrogen gas flow rate of 2 sccm, and a deposition pressure of 0.30 Pa while the workpiece (optical waveguide film main body) is rotated at a rate of 2 revolutions/minute without being heated, so as to form a TiN layer having a thickness of 20 nm that covers the silver alloy mirror layer.

Since the high-rate sputtering apparatus (SH-450) manufactured by ULVAC Incorporated can accommodate four kinds of targets, the above two layers are formed in a series of operations without being exposed to the outside atmospheric air during the operations.

Evaluation of Optical Waveguide Film

The properties of the mirror layer are evaluated in the same manner as in Example 1. The observed reflection loss is 0.3 dB, indicating excellent properties of the mirror layer. In order to evaluate long-term reliability, an accelerated test on the long-term reliability is performed by immersing the obtained optical waveguide film in a 5% by weight saline water for 24 hours; as a result, whitening due to chlorination is slightly observed at the mirror layer, so that its long-term reliability is found to be inferior to a case in which the Ti layer is provided. For the purpose of comparison, a sample having only the silver alloy layer (mirror layer) without the TiN layer is prepared and evaluated; as a result complete whitening is observed and the reflectance is greatly decreased in this sample.

Example 4

An optical transmitter and receiver module is produced in the same manner using the same materials as in Example 1, except that, when the three-layered film prepared in Example 1 is cut by the dicing saw, one 50 μm-square-shaped core is formed by cutting from the principal surface (the top surface) side to a depth of 75 μm±5 μm ("5 μm" representing the cutting accuracy) and cutting again after shifting the cutting position by 50 μm in the width direction.

The minimum bend radius of the optical waveguide film whose surface is covered with the flame-retardant resin in the optical transmitter and receiver module prepared above is measured according to the ASTM D-2176, and is found to be 1.5 mm. Therefore, it is confirmed that a photoelectric-combined optical transmitter and receiver module having a simple structure, high flexibility, and superior flame-retardancy is provided.

Example 5

An optical transmitter and receiver module is prepared in the same manner using the same materials as in Example 4, except that the flame-retardant resin is replaced by a flame-retardant resin having the following properties and the curing of the flame-retardant resin after application is performed by heating at 120° C. for one hour.

In Example 5, a two-component type addition-curable silicone resin manufactured by Shin-Etsu Chemical Co., Ltd. is used as the flame-retardant resin. The properties of the flame-retardant resin used in Example 5

| | |
|---|---|
| Viscosity in uncured state: | 1 Pa·s |
| Tensile strength: | 1.0 MPa |
| Content of low-molecular-weight siloxane in which the amount of cyclic dimethyl siloxane (D unit) is from D3 (trimer) to D20 (icosamer): | less than 500 ppm |
| Type of the flame-retardant filler: | silicon oxide |
| Content of the flame-retardant filler: | 10% by weight |
| Flame-retardancy according to the UL94 test: | V-0 |

The minimum bend radius of the optical waveguide film whose surface is covered with the flame-retardant resin in the optical transmitter and receiver module prepared above is measured according to the ASTM D-2176, and is found to be 1.5 mm.

Therefore, it is confirmed that a photoelectric-combined optical transmitter and receiver module having a simple structure, high flexibility, and superior flame-retardancy is provided.

Example 6

When the electric wiring portions and the protective layer are formed on the optical waveguide film main body, a 5 μm-thick coating layer formed of an epoxy UV-curable resin is provided on the upper surface (except for the inclined surfaces) of the optical waveguide film main body, and the mask is disposed on the coating layer formed of the epoxy UV-curable resin. Thereafter, UV rays are irradiated from above the mask, so as to cure the exposed coating layer formed of the UV-curable resin at the openings of the mask. The uncured coating film formed of the UV-curable resin at portions covered with the mask works as an attachment layer. An optical waveguide film and an optical transmitter and receiver module are prepared in the same manner as in Example 1, except for the above procedure.

When the electric wiring portions of the obtained optical waveguide film are observed, the outlines of the lines of the electric wiring portions are clearly observable and are not distorted, compared with the optical waveguide film of Example 1. This indicates that there is no space between the mask and the optical waveguide film main body. The mask is easily removed without excessively adhering to the optical waveguide film main body.

Example 7

When the electric wiring portions and the protective layer are formed on the optical waveguide film main body, a 5 μm-thick coating layer formed of a thermosetting epoxy resin is provided on the upper surface (except for the inclined surfaces) of the optical waveguide film main body, and the mask is disposed on the coating layer formed of the thermosetting epoxy resin. The optical waveguide film main body at which the mask is disposed is left in an environment of 130° C. for 1 hour, so as to cure the coating layer of the epoxy resin; the cured coating layer serves as an attachment layer. An optical waveguide film and an optical transmitter and receiver module are prepared in the same manner as in Example 1 except for the above procedure.

When the electric wiring portions of the obtained optical waveguide film are observed, the outlines of the lines of the electric wiring portions are clearly observable and are not distorted, compared with the optical waveguide film of Example 1. This indicates that there is no space between the mask and the optical waveguide film main body. The mask is easily removed from the optical waveguide film main body, to leave the attachment layer adhering to the optical waveguide film main body.

Example 8

When the electric wiring portions and the protective layer are formed on the optical waveguide film main body, a 10 μm-thick coating layer formed of a silicone elastomer (SYLGARD 184 (tradename) manufactured by Dow Corning Corporation) is provided on the upper surface (except for the inclined surfaces) of the optical waveguide film main body, and the mask is disposed on the coating layer. The silicone elastomer is formed of polydimethylsiloxane (PDMS), which is a thermosetting silicone-type adhesive. The optical waveguide film main body at which the mask is disposed is left in an environment of 130° C. for 1 hour, so as to cure the coating layer of PDMS; the cured coating layer of PDMS serves as an attachment layer. An optical waveguide film and an optical transmitter and receiver module are prepared in the same manner as in Example 1 except for the above procedure.

When the electric wiring portions of the obtained optical waveguide film are observed, the outlines of the lines of the electric wiring portions are clearly observable and are not distorted, compared with the optical waveguide film of Example 1. This indicates that there is no space between the mask and the optical waveguide film main body. The mask is easily removed from the optical waveguide film main body, to leave the attachment layer adhering to the optical waveguide film main body.

Example 9

First, a moisture-curing silicone adhesive (KE-1842 (tradename) manufactured by Shin-Etsu Chemical Co., Ltd.) is applied to a mask, heated at 120° C. for one hour, whereby a mask having an attachment layer formed of the cured silicone resin is obtained. Specifically, the silicone resin is applied to an ARTON film formed of a polyolefin resin by a spin coating method, thereby forming a layer having a thickness of 30 μm. The mask is tightly attached to the silicone resin, and the silicone resin is heated at 120° C. for one hour to be cured. The cured silicone resin does not adhere to the ARTON film made of a polyolefin resin, but adheres to the electroformed Ni metal mask; therefore, the mask is peeled off the ARTON film with the cured silicone resin adhering to the mask, so that a mask having an attachment layer formed of the silicone resin is obtained. When the electric wiring portions and the protective layer are formed on the optical waveguide film main body, the mask having the attachment layer is used. An optical waveguide film and an optical transmitter and receiver module are prepared in the same manner as in Example 1, except for the above procedure.

When the electric wiring portions of the obtained optical waveguide film are observed, the outlines of the lines of the electric wiring portions are clearly observable and are not distorted, compared with the optical waveguide film of Example 1. This indicates that there is no space between the mask and the optical waveguide film main body. The mask is easily removed from the optical waveguide film main body, with the attachment layer adhering to the mask.

Example 10

When the electric wiring portions and the protective layer are formed on the optical waveguide film main body, a 0.5 μm-thick release layer formed of a silicone lubricant is provided on the upper surface (except for the inclined surfaces) of the optical waveguide film main body, and then a moisture-curing silicone adhesive (KE-1842 (tradename) manufactured by Shin-Etsu Chemical Co., Ltd.) is applied thereto to form a coating layer having a thickness of 5 μm, and then the mask is disposed on the silicone adhesive coating layer. The optical waveguide film main body at which the mask is disposed is left at room temperature (25° C.) for one hour, so as to cure the silicone adhesive coating layer; the cured coating layer serves as an attachment layer. An optical waveguide film and an optical transmitter and receiver module are prepared in the same manner as in Example 1 except for the above procedure.

When the electric wiring portions of the obtained optical waveguide film are observed, the outlines of the lines of the electric wiring portions are clearly observable and are not distorted, compared with the optical waveguide film of Example 1. This indicates that there is no space between the mask and the optical waveguide film main body. Although the moisture-curing silicone adhesive is intrinsically capable of adhering to both the mask and the optical waveguide film main body, the mask is easily removed from the optical waveguide film main body, with the attachment layer formed of the silicone adhesive adhering to the mask, owing to the presence of the release layer.

What is claimed is:

1. An optical waveguide film, comprising:
    an optical waveguide film main body including an optical waveguide core through which light travels and a cladding portion that surrounds the optical waveguide core and has a lower refractive index than that of the optical waveguide core;
    an electric wiring portion including silver or a silver alloy and formed on at least a part of a principal surface of the optical waveguide film main body; and
    a protective layer including a titanium layer or a titanium alloy layer and disposed to cover the electric wiring portion.

2. The optical waveguide film according to claim 1, wherein the protective layer further comprises a titanium nitride layer disposed on the titanium or titanium alloy layer.

3. The optical waveguide film according to claim 1, wherein the electric wiring portion and the protective layer are integrated with each other to form an integrated layer, and a surface of the integrated layer includes a complex alloy of titanium and silver.

4. The optical waveguide film according to claim 1, further comprising an inclined surface, which is an optical-path deflecting portion that changes a direction of an optical path of light traveling through the optical waveguide core, at an end portion at at least one end of the optical waveguide film in a longitudinal direction of the optical waveguide film, and the inclined surface is provided with a reflection layer that is formed of the same material as that forming the electric wiring portion.

5. The optical waveguide film according to claim 1, wherein a thickness of the electric wiring portion is from about 500 nm to about 5 μm, and a minimum bend radius of the optical waveguide film is from about 1 mm to about 3 mm.

6. An optical transmitter and receiver module comprising:
    the optical waveguide film of claim 1;
    an optical transmitter section including a light-emitting device and a first holding member holding the light-emitting device, the first holding member holding a light-incident end of the optical waveguide film such that light emitted from the light-emitting device enters the optical waveguide film from the light-incident end surface of the optical waveguide core;

an optical receiver section including a light-receiving device and a second holding member holding the light-receiving device, the second holding member holding an output end of the optical waveguide film such that light coming out of the output end surface of the optical waveguide core is received by the light-receiving device; and a wire connection section provided at each of the first holding member and the second holding member and electrically connected to the electric wiring portion of the optical waveguide film.

7. The optical transmitter and receiver module according to claim 6, wherein at least the optical waveguide film is covered with a flame-retardant resin having flame-retardancy of HB or higher according to the UL-94 test, and the optical waveguide film having a flame-retardant resin layer formed at a surface covered with the flame-retardant resin has a minimum bend radius of from about 1 mm to about 3 mm.

8. The optical transmitter and receiver module according to claim 7, wherein the optical waveguide film and at least one of the light-emitting device, the light-receiving device, or the wire connection section are covered with the flame-retardant resin.

9. The optical transmitter and receiver module according to claim 7, wherein the viscosity of the flame-retardant resin is from about 1 Pa·s to about 30 Pa·s.

10. The optical transmitter and receiver module according to claim 7, wherein the thickness of the flame-retardant resin layer is from about 20 μm to about 100 μm.

* * * * *